(12) United States Patent
Tatsukami

(10) Patent No.: US 7,672,123 B2
(45) Date of Patent: Mar. 2, 2010

(54) APPARATUS, DATA PROCESSING APPARATUS AND HEAT RADIATING MEMBER

(75) Inventor: Ikki Tatsukami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 342 days.

(21) Appl. No.: 11/656,552

(22) Filed: Jan. 23, 2007

(65) Prior Publication Data
US 2008/0043429 A1 Feb. 21, 2008

(30) Foreign Application Priority Data
Aug. 16, 2006 (JP) .............................. 2006-222130

(51) Int. Cl.
*H05K 5/00* (2006.01)
*H05K 7/20* (2006.01)

(52) U.S. Cl. ............................ 361/679.54; 361/679.46; 361/679.48

(58) Field of Classification Search ................. 361/687, 361/695, 697, 703, 679.46, 679.48, 679.54
See application file for complete search history.

(56) References Cited

U.S. PATENT DOCUMENTS

| | | | | |
|---|---|---|---|---|
| 5,734,555 | A * | 3/1998 | McMahon | 361/704 |
| 6,239,972 | B1 * | 5/2001 | Tehan et al. | 361/704 |
| 6,407,921 | B1 * | 6/2002 | Nakamura et al. | 361/700 |
| 6,659,168 | B1 * | 12/2003 | Barsun | 165/80.3 |
| 6,947,286 | B2 * | 9/2005 | Belady et al. | 361/719 |
| 7,339,787 | B2 * | 3/2008 | Cheng et al. | 361/695 |
| 7,436,673 | B2 * | 10/2008 | Wang et al. | 361/719 |
| 2004/0264114 | A1 * | 12/2004 | Hachiya | 361/676 |

FOREIGN PATENT DOCUMENTS

| | | |
|---|---|---|
| CN | 2484588 Y | 4/2002 |
| JP | 05-066095 | 3/1993 |
| JP | 06-069672 | 3/1994 |
| JP | 2004-274086 | 9/2004 |
| JP | 2005-228954 | 8/2005 |

OTHER PUBLICATIONS

Office Action mailed on Sep. 4, 2008 and issued in corresponding Korean Patent Application No. 10-2007-0007931.

* cited by examiner

*Primary Examiner*—Jayprakash N Gandhi
*Assistant Examiner*—Anthony M Haughton
(74) *Attorney, Agent, or Firm*—Staas & Halsey LLP

(57) ABSTRACT

An apparatus includes: a first heat generating component; a second heat generating component arranged close to the side of the first heat generating component; a heat radiating member that absorbs heat from both the first heat generating component and the second heat generating component and radiates heat. The heat radiating member includes: a base section that extends horizontally and contacts the first heat generating component on the bottom surface of the base section; and a pair of arms that extend horizontally at both ends of the base section, have a fastener for fastening the heat radiating member, and contact the second heat generating component under one of the pair of arms.

12 Claims, 40 Drawing Sheets

APPARATUS, DATA PROCESSING APPARATUS AND HEAT RADIATING MEMBER

CROSS REFERENCE TO RELATED APPLICATIONS

This application claims the benefit under 35 U.S.C. Section 119, of Japanese Patent Application No. 2006-222130, filed Aug. 16, 2006, which is hereby incorporated by reference in its entirety into this application.

BACKGROUND OF THE INVENTION

1. Field of the Invention

The present invention relates to an apparatus that has a built-in heat generating component, to a data processing apparatus that has a built-in heat generating component and performs data processing, and to a heat radiating member for the heat radiating component.

2. Description of the Related Art

There are various types of apparatuses having a built-in component that generates heat when in use. Although some of them perform their intended function by generating heat, it is not desirable for the other apparatuses to generate heat by the built-in component. Thus, some techniques are devised to suppress rise in temperature of the apparatus due to heat generated by the built-in heat generating component. One such technique disclosed in Japanese Patent Application Publication No. 2005-228954 is that a flexible heat pipe is utilized for effective radiation of heat in narrow space, while Japanese Patent Application Publication No. 5-66095 discloses a technique that an elastic and bent heat pipe is used so that the heat pipe becomes in contact more closely with heat generating component that is to be cooled down. Further, Japanese Patent Application Publication No. 6-69672 discloses a technique that when a single heat radiating member is used to radiate heat of the aligned multiple heat generating components whose height respectively differ, a step is provided so as to offset difference in the height of the multiple heat generating components.

When there are multiple heat generating components, a typical technique is to integrally radiate heat generated by the multiple heat generating components. Such an integrated heat radiating structure is not considered in the techniques disclosed in Japanese Patent Application Publication Nos. 2005-228954 and 5-66095 that relate to a structure in which heat is radiated for an individual heat generating component. At this point, Japanese Patent Application Publication No. 6-69672 discloses integrally radiating heat of the multiple heat generating components by using a single heat radiating member. However, it raises a problem in terms of reduction in size as it discloses a structure in which multiple heat radiating fins constituting the heat radiating member is formed to extend along the whole of the multiple heat generating components. Additionally, from the view point of reduction in cost, it is desirable to apply a single heat radiating member to plural kinds of apparatuses, however, which is not taught in any of the above cited techniques.

SUMMARY OF THE INVENTION

The present invention has been made in view of the above circumstances, and provides an apparatus and a data processing apparatus having a new heat radiating structure that radiates heat of multiple heat generating components, and a heat radiating member suitable for the new heat radiating structure.

An apparatus according to the invention includes:

a first heat generating component;

a second heat generating component arranged close to a side of the first heat generating component;

a heat radiating member that absorbs heat from both the first heat generating component and the second heat generating component and radiates heat;

wherein the heat radiating member includes:

a base section that extends horizontally and contacts the first heat generating component on the bottom surface of the base section; and a pair of arms that extend horizontally at both ends of the base section, have a fastener for fastening the heat radiating member, and contact the second heat generating component under one of the pair of arms.

According to the structure described above, heat from the first heat generating component is conducted via the base section to the heat radiating member, while heat from the second heat generating component is conducted via one of the arms to the heat radiating member. Accordingly, the apparatus of the invention can realize reduction in space compared with the technique disclosed in Japanese Patent Application Publication No. 6-69672 that multiple heat radiating fins constituting the heat radiating member is formed to extend along the whole of the multiple heat generating components.

Preferably, the apparatus is a first type of apparatus or a second type of apparatus, the first type of apparatus having a structure that the second heat generating component is arranged close to one of sides of the first heat generating component, the second type of apparatus having a structure that the second heat generating component is arranged close to the other of the sides of the first heat generating component, wherein the heat radiating member is compatible with the first and the second types of apparatuses, and wherein, in the first type of apparatus, one of the arms of the heat radiating member is made to contact the second heat generating component thereunder, and in the second type of apparatus, the other of the arms is made to contact the second heat generating component thereunder.

In the first heat generating component, heat is conducted via the base section to the heat radiating fins just above the base section. Thus, in the first heat generating component, heat is radiated more effectively than the second heat generating component where heat is conducted via the one of the arms, which projects from the side of the heat radiating fins, to the heat radiating fins. According to the invention, whether heat of the second heat generating component is conducted via a right arm or a left arm is determined by whether the second heat generating component is positioned right or left of the first heat radiating component. Accordingly, in both cases; the heat radiating member of the same structure can be used.

More preferably, height of a top surface of the second heat generating component with reference to a top surface of the first heat generating component differs between the first apparatus and the second apparatus, wherein at least one of the arms has a projection partially formed therein that absorbs difference in height of the second heat generating component between the first apparatus and the second apparatus.

As the projection is partially formed in the one of the arms that contacts the second apparatus, it is possible to absorb difference in height of the second heat generating component between the first apparatus and the second apparatus. Accordingly, in both the first and second apparatuses, a predetermined heat radiation efficiency can be maintained. Additionally, as the projection is partially formed, the same projection can be formed either in the right or left arm, which makes it easy to attach.

Further preferably, the heat radiating member has plural heat radiating fins that stand on the base section and a fixed section that extends from both ends of the heat radiating fins and over a top surface of the heat radiating fins, wherein the pair of arms are formed by extending the fixed section.

Accordingly, heat from the first heat generating component is conducted via the base section to the bottom of the heat radiating fins, while heat from the second heat generating component is conducted via the one of the arms and the fixed section to the top face of the heat radiating fins. Such different heat radiation routes enable efficient heat conductibility and radiation.

The first heat generating component may be a CPU that performs data processing.

Recent high-speed data processing has resulted in increased amount of heat from a CPU. However, it is possible to radiate heat effectively from the CPU serving as the first heat generating component.

Preferably, a data processing apparatus of the invention that performs data processing including:
a first heat generating component;
a second heat generating component arranged close to a side of the first heat generating component;
a heat radiating member that has heat radiating fins for air cooling, absorbs heat from both the first heat generating component and the second heat generating component and radiates heat;
a fan that sends air toward the heat radiating member; and
a housing incorporating the first and the second heat generating components, the heat radiating member and the fan, the housing including:
a keyboard for input operation arranged on a top surface thereof; and
an opening that discharges air warmed up by the heat radiating member to outside, the opening formed in one side of the apparatus.

The data processing apparatus has, in addition to the basic structure of the apparatus of the invention, the fan for forced air cooling and is configured to discharge warmed air to the outside the apparatus. Accordingly, efficient heat radiation is enabled.

Preferably, in the data processing apparatus, the opening is formed in a back face of the housing and the fan is arranged at least partially under the keyboard and the heat radiating member is arranged at a position behind the keyboard.

Disposing the heat radiating member behind the keyboard enables the heat radiating fins to be sufficiently high, so that coolability is ensured. Additionally, efficient air cooling is realized by sending air from the fan under the keyboard to the heat radiating fins and by discharging the air from the back face of the housing.

The data processing apparatus of the invention can be applied to, for example, a notebook personal computer having a second housing in addition to the housing as a first housing, the second housing being connected through a hinge to the first housing at the back of the first housing such that the second housing is openable and closable relative to the first housing, and has a display screen that displays an image.

Further preferably, the data processing apparatus of the invention is a first type of data processing apparatus or a second type of data processing apparatus, the first type of data processing apparatus having a structure that the second heat generating component is arranged close to one of sides of the first heat generating component, the second type of data processing apparatus having a structure that the second heat generating component is arranged close to the other of the sides of the first heat generating component, wherein the heat radiating member is compatible with the first and the second types of data processing apparatuses, and wherein, in the first type of data processing apparatus, one of the arms is made to contact the second heat generating component thereunder, and in the second type of data processing apparatus, the other of the arms is made to contact the second heat generating component thereunder.

More preferably, height of a top surface of the second heat generating component with reference to a top surface of the first heat generating component differs between the first apparatus and the second apparatus, wherein at least one of the arms has a projection partially formed therein that absorbs difference in height of the second heat generating component between the first and the second types of apparatuses.

Heat radiating members applied to the heat generating components of the apparatus and the data processing apparatus described above are also features of the invention.

As described above, the present invention can provide the apparatus and the data processing apparatus having the new heat radiating structure that radiates heat of multiple heat generating components, and the heat radiating member suitable for the new heat radiating structure.

BRIEF DESCRIPTION OF THE DRAWINGS

Embodiment(s) of the present invention will be described below with reference to the attached drawings.

DETAILED DESCRIPTION OF THE INVENTION

Embodiment(s) of the present invention will be described below with reference to the attached drawings.

Figure 1:
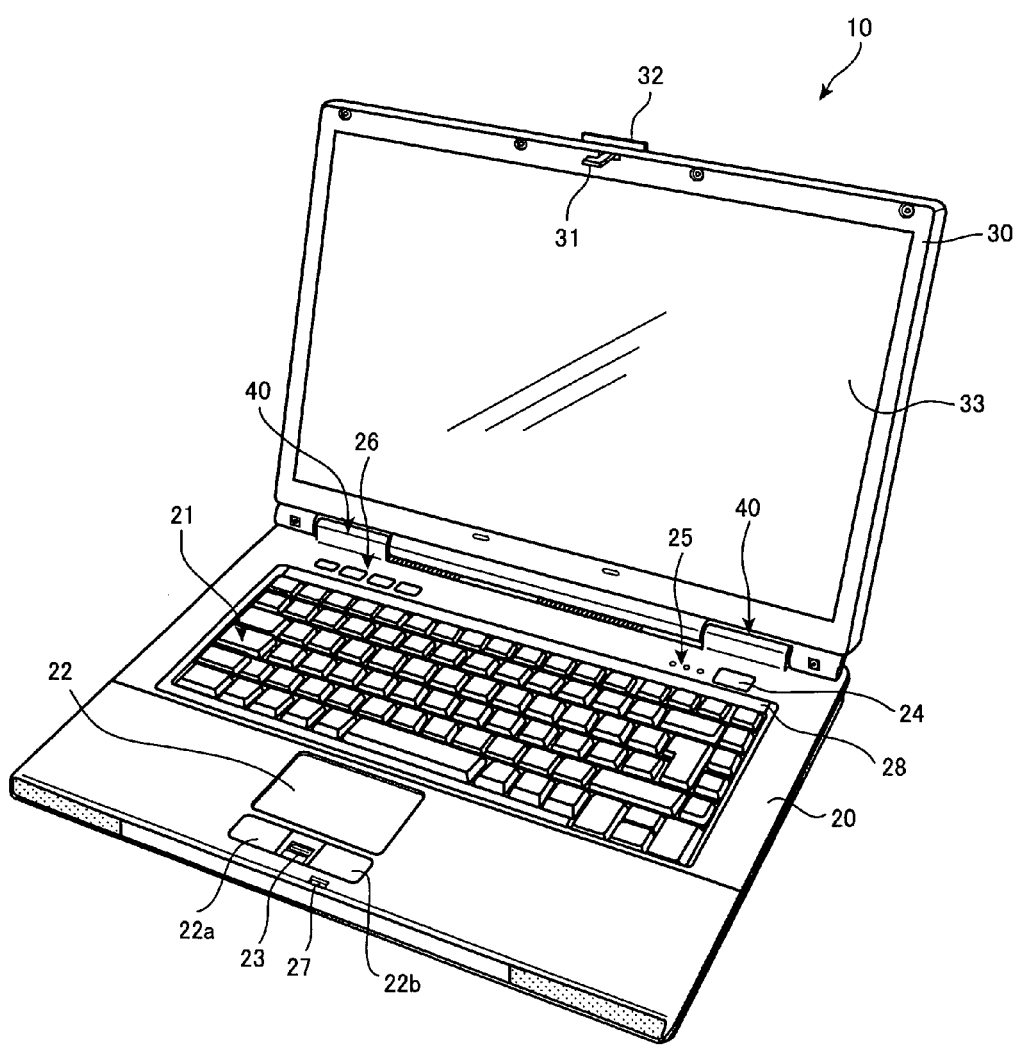
FIG. 1 is a perspective view of a notebook computer (hereafter referred to as note PC) when opened.
Figure 2:
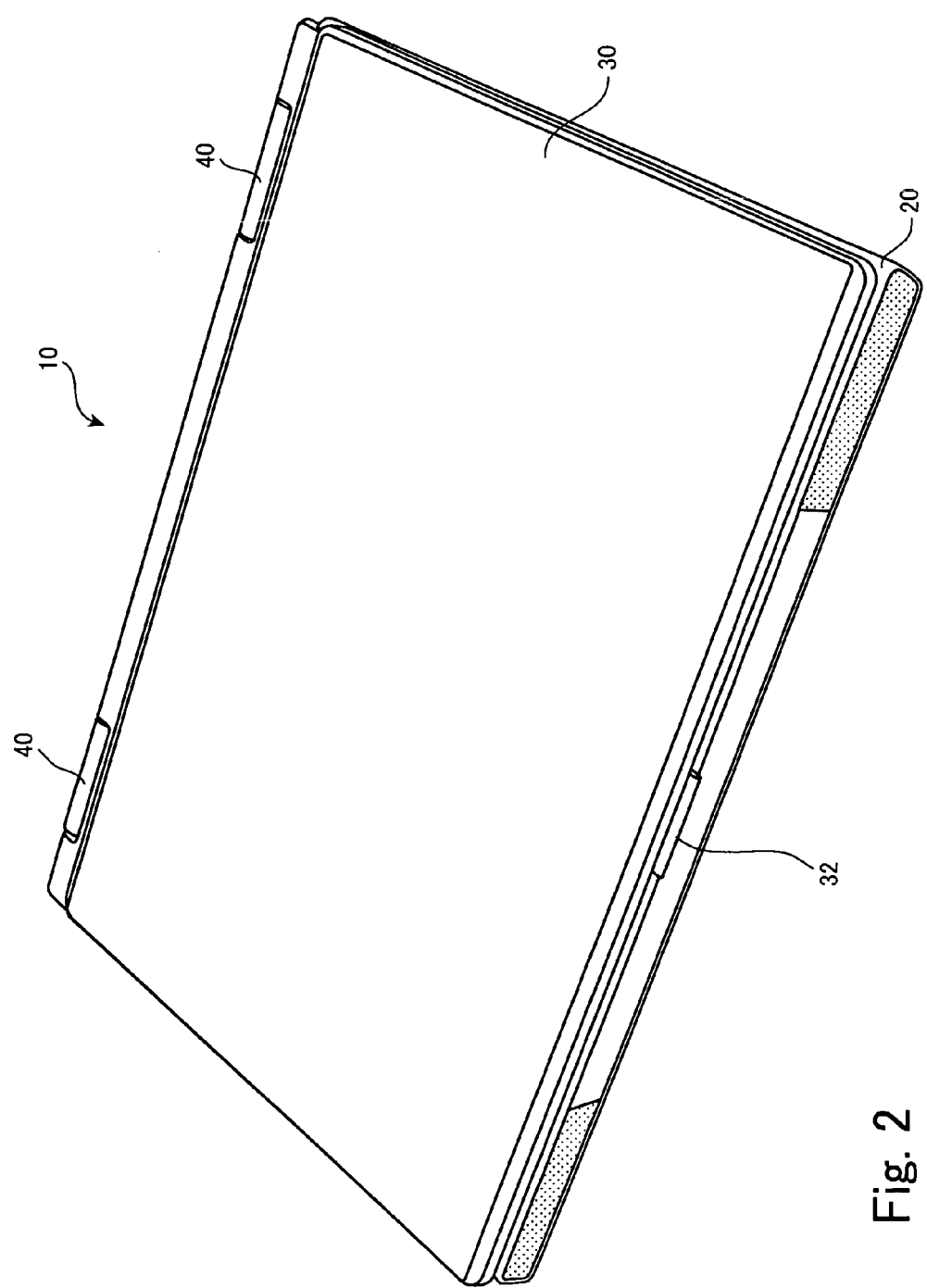
FIG. 2 is a perspective view of the note PC shown in FIG. 1 when closed, as viewed obliquely from its front.
Figure 3:
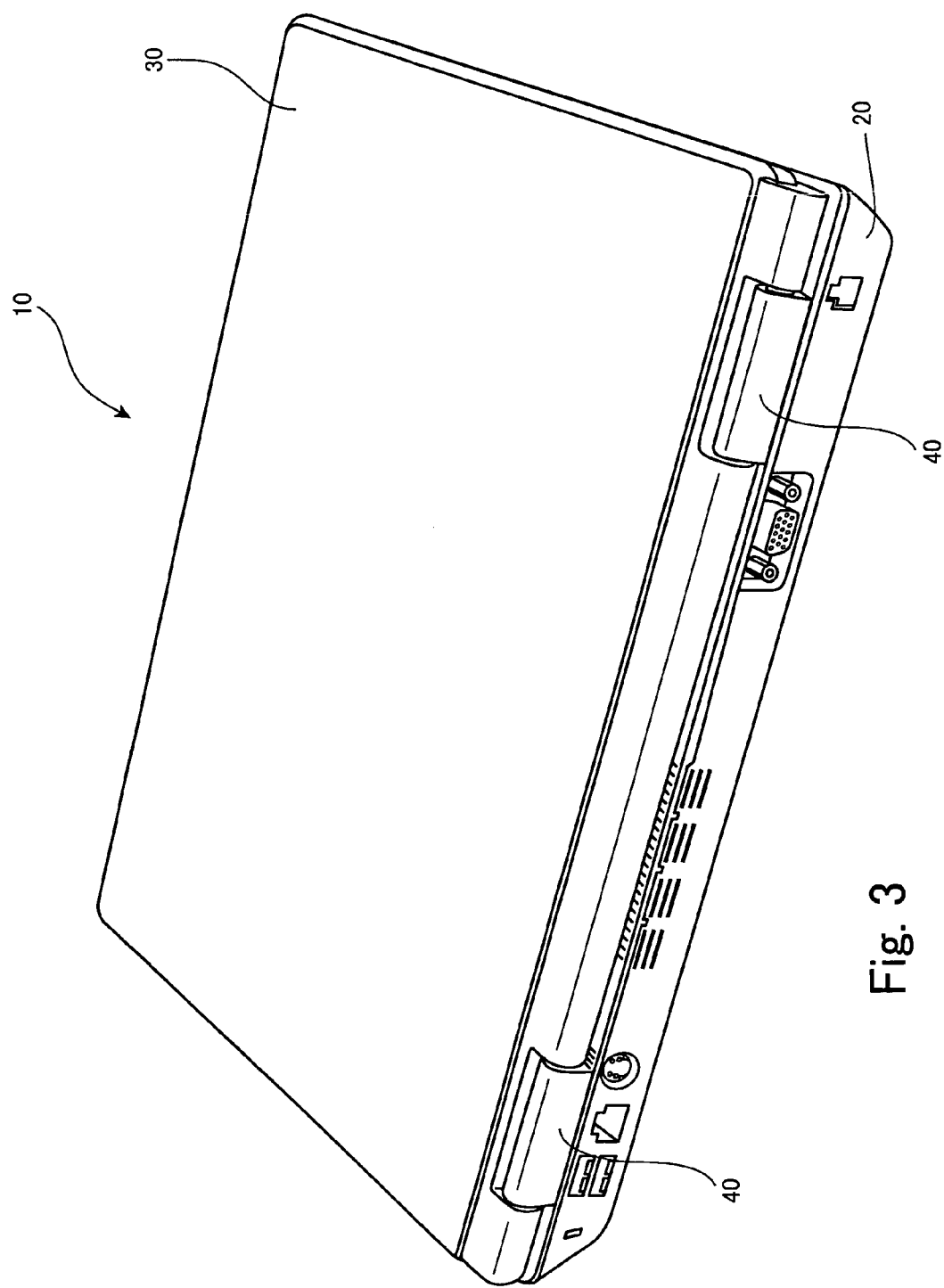
FIG. 3 is a perspective view of the note PC shown in FIG. 1 when closed, as viewed obliquely from its back.

FIG. 1 is a perspective view of a notebook computer 10 (hereafter referred to as a notebook PC) when closed, FIG. 2 is a perspective view of the notebook PC 10 when closed, as viewed obliquely from its front, and FIG. 3 is a perspective view of the notebook PC 10 when closed, as viewed obliquely from its back.

The notebook PC 10 is composed of a main unit 20 and a display unit 30. The display unit 30 is connected via a hinge mechanism 40 with the main unit 20 at the back of the main unit 20 so as to be openable and closable.

The main unit 20 has various components incorporated in the housing thereof, including circuits such as CPU, a hard disc drive unit to access a CD and a DVD loaded therein, a PC card slot to access a PC card inserted therein, a memory card slot to access various kinds of memory cards inserted therein and so on.

On the top face of the main unit 20, disposed are a keyboard 21, a touchpad 22, right and left push buttons 22b and 22a, a fingerprint sensor 23 disposed between the push buttons 22b and 22a, a power button 24 disposed at the right back, plural indicator lamps 25 and plural function buttons 26 disposed at the left back.

Further disposed on the top face of the main unit 20 are a locking aperture 27 at a substantial center of the front thereof. The locking aperture 27 receives a locking claw 31 of the display unit 30, when the display unit 30 is closed to be overlaid over the main unit 20, and the display unit 30 locks into the main unit 20 such that the display unit 30 does not easily open. To open the display unit 30, an unlocking button 32 of the display unit 30 is to be pressed to unlock the locking claw 31 and the display unit 30 is to be lifted with a hand. Additionally, a long and narrow cover member 28 extending laterally is disposed at the back of the keyboard 21 on the top face of the main unit 20, which will be described later in detail.

The display unit 30 has, in addition to the locking claw 31 and the unlocking button 32, a display screen 33 disposed at the inside thereof and facing the main unit 20 when closed. Various images are displayed on the display screen 33 in response to instructions from the CPU of the main unit 20.

The hinge mechanism 40 supports the display unit 30 such that the display unit 30 can open and close relative to the main unit 20 and can be kept opening at any degree by friction of the hinge mechanism 40.

Figure 4:
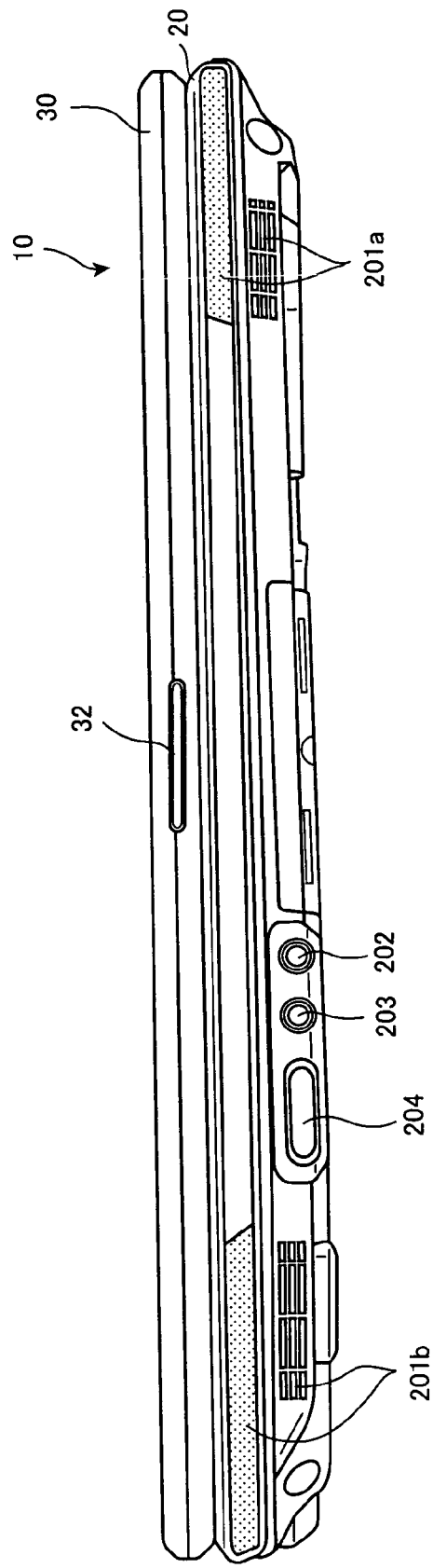
FIG. 4 shows a front face of the note PC shown in FIGS. 1 through 3 when closed.

FIG. 4 shows a front face of the notebook PC 10 shown in FIGS. 1 through 3 when closed.

On the flank of the front of the main unit 20, audio output ports 201a, 201b are disposed respectively at the left and right thereof to output sound from a built-in microphone to outside the apparatus. Further, disposed are a microphone connection port 202 for connecting a microphone jack thereto, a headphone connection port 203 for connecting a headphone jack thereto, and an On/Off switch 204 for turning on/off wireless LAN function.

Figure 5:
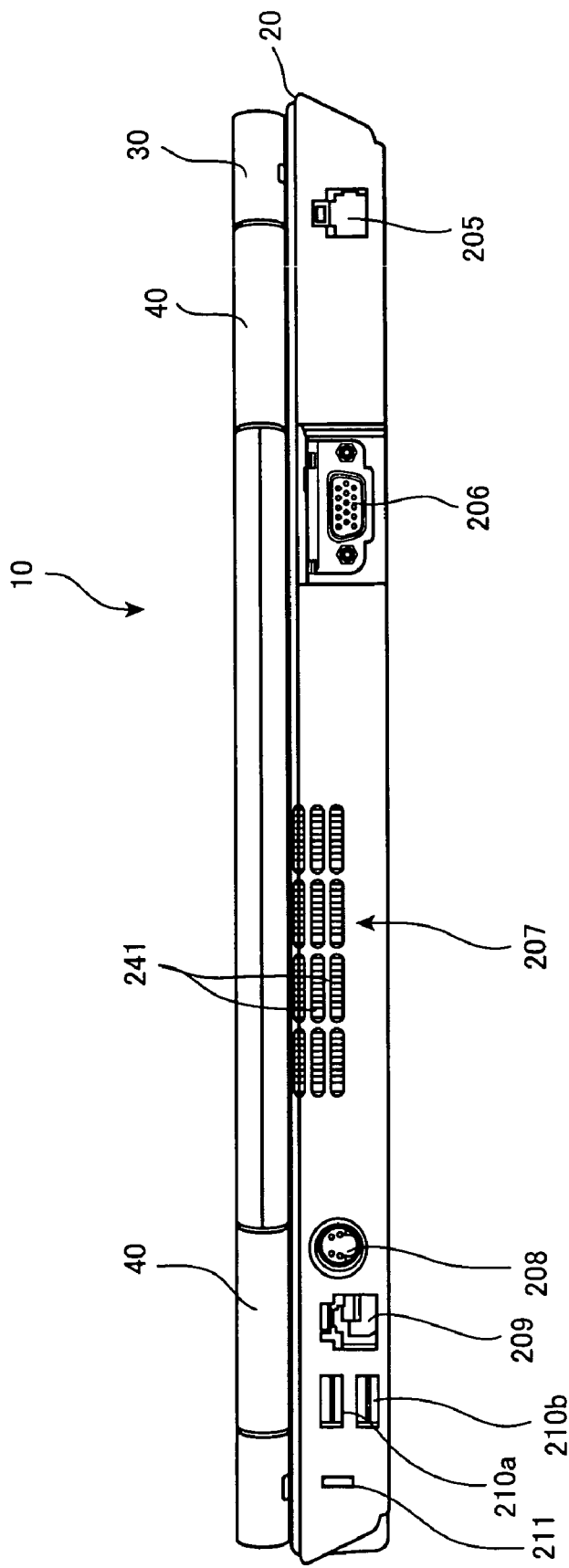
FIG. 5 shows a back face of the note PC shown in FIGS. 1 through 3 when closed.

FIG. 5 shows a back face of the notebook PC 10 shown in FIGS. 1 through 3 when closed.

As shown in FIG. 5, on the flank of the back of the main unit 20, disposed in the order from the right to the left are a modem circuit connecting port 205, an external monitor connecting connector 206, air outlets 207 from which air blown from a fan inside the main unit 20 is discharged, a video output terminal 208, a LAN connection terminal 209, two USB connection terminals 210a, 210b and a locking aperture 211 for connecting a theft-proof wire thereto.

It should be noted that in FIG. 5 heat radiating fins 241 of a heat radiating member 240 (see FIG. 11) are exposed to be seen at the back of the air outlets 207.

Figure 6:
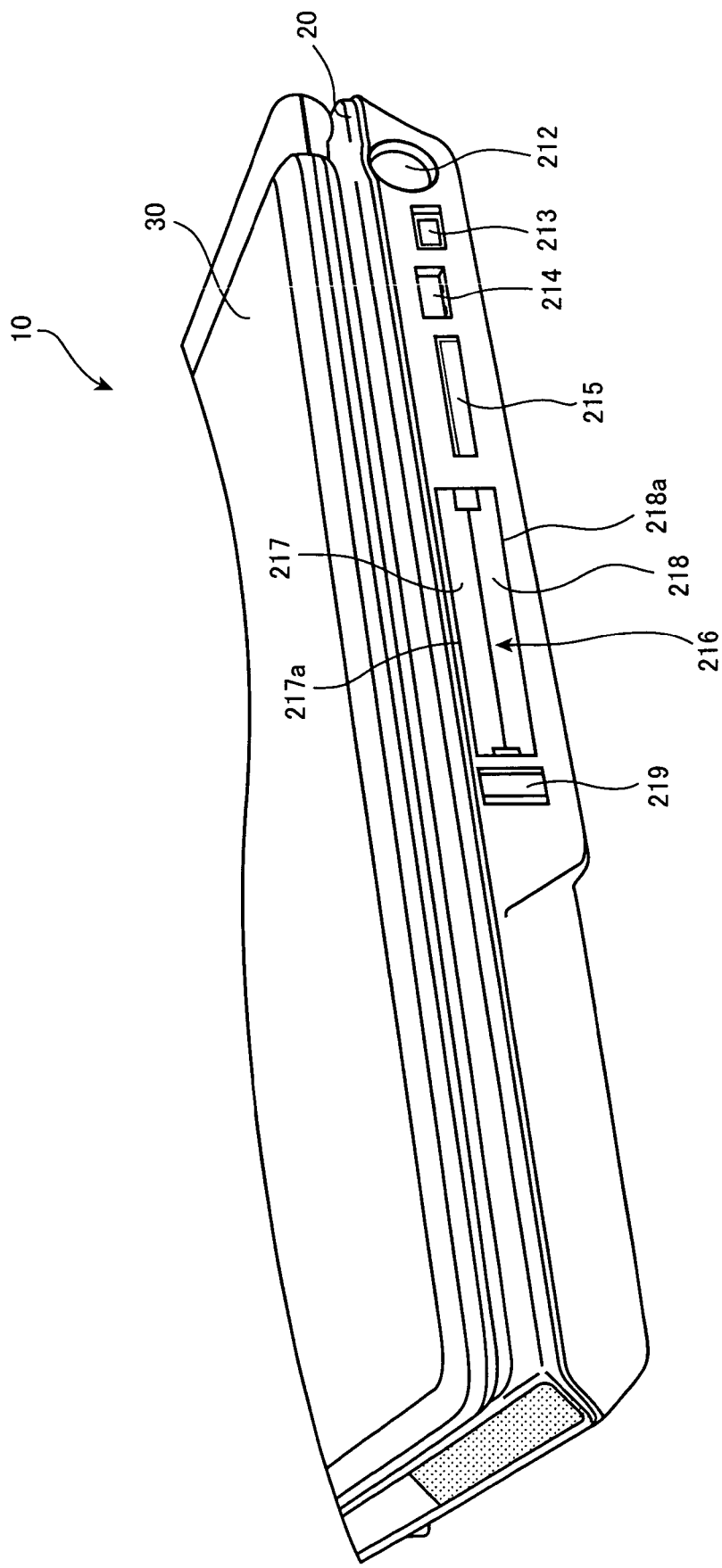
FIG. 6 shows a right flank of the note PC shown in FIGS. 1 through 3 when closed.

FIG. 6 shows a right flank of the notebook PC 10 shown in FIGS. 1 through 3 when closed.

As shown in FIG. 6, on the flank of the right of the notebook PC 10, there are disposed an AC adopter (not shown) power cable connecting port 212, an IEEE 1394 connecting terminal 213, a USB connecting terminal 214, a media loading opening 215 in which plural types of storage media, four in the embodiment, can be inserted, and a PC card loading opening 216 in which plural PC cards are to be inserted. As will be described later, in the main unit 20, upper and lower PC card slots capable of accommodating two PC cards and having corresponding upper and lower cover members 217 and 218 are disposed inside the PC card loading opening 216. When no PC card is loaded, the cover members 217 and 218 are pressed by a spring from inside the housing of the main unit 20 so as to be closed, as shown in FIG. 6. The notebook PC card loading opening 216 is adopted to be opened in the following manner: when a PC card is inserted into the upper PC slot, the upper cover member 217 is pressed by the front end of the PC card and rotated such that the upper cover member 217 is lifted up around a top edge 217a thereof; on the other hand, when a PC card is inserted into the lower PC slot, the lower cover member 218 is pressed by the front end of the PC card and rotated such that the lower cover member 218 goes down around a bottom edge 218a thereof. In order to pull the inserted PC card from the PC card loading opening 216, an eject button 219 disposed next to the PC card loading opening 216 is to be pressed.

Figure 7:
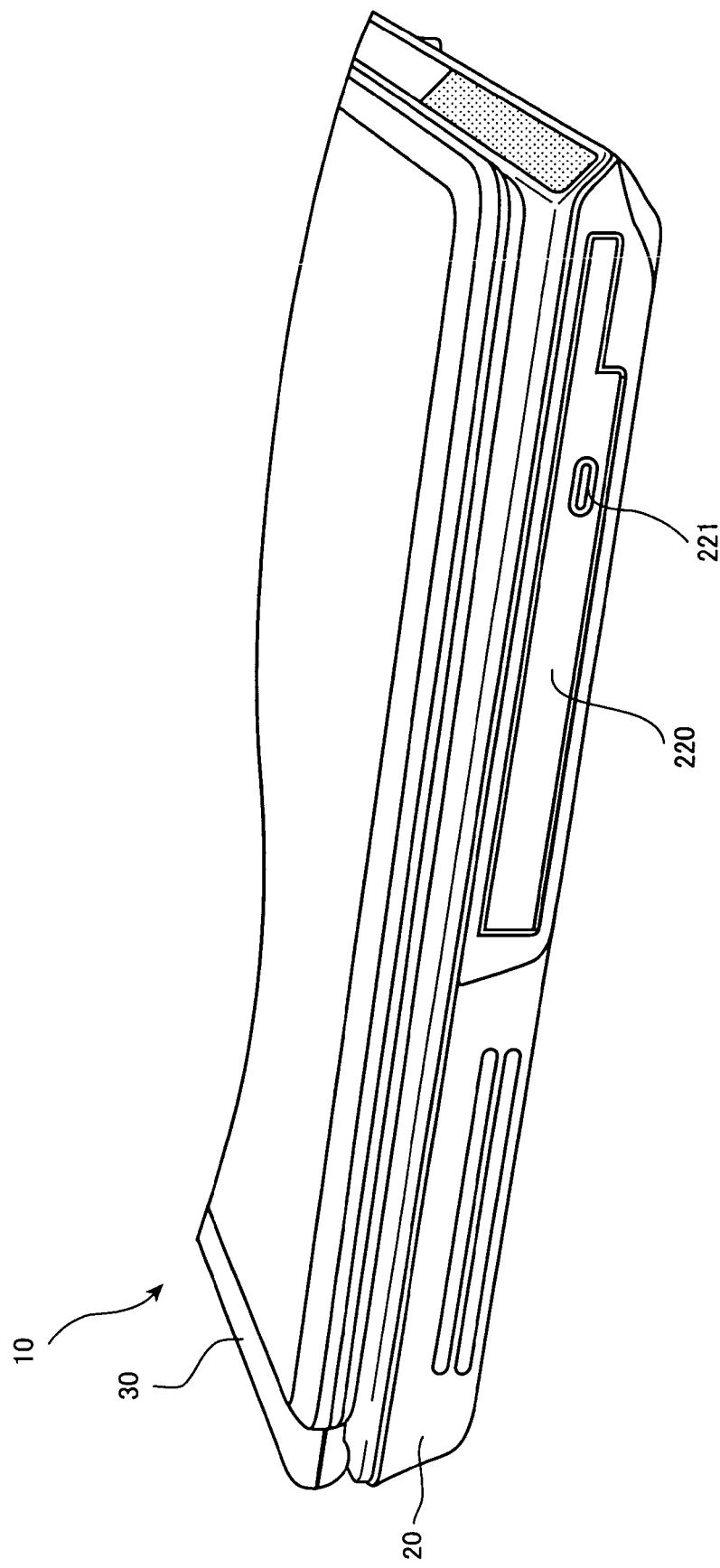
FIG. 7 shows a left flank of the note PC shown in FIGS. 1 through 3 when closed.

FIG. 7 shows a left flank of the notebook PC 10 shown in FIGS. 1 through 3 when closed.

On the flank of the left of the main unit 20, arranged is an end face of a disc drive unit 220 to access a CD and a DVD loaded therein. Pressing an eject button 221 causes a tray to pop out from inside the housing of the main unit 20. Placing CD and DVD on the tray and pushing it enables the CD and DVD to be accessed by the disc drive unit 220. When removing the CD and DVD, the eject button 221 is to be pressed similarly.

Incidentally, an opening of the same shape as that of the end face of the disc drive unit 220 is formed in the housing of the main unit 20. Thus, when doing a maintenance check, the whole of the disc drive unit 220 can be pulled out from inside the housing of the main unit 20 and reinserted therein.

So far, the notebook PC 10 as a whole has been described. In the following, the details of each section of the notebook PC 10 will be described. (Structure of air inlet portion of heat radiating fins)

Figure 8:
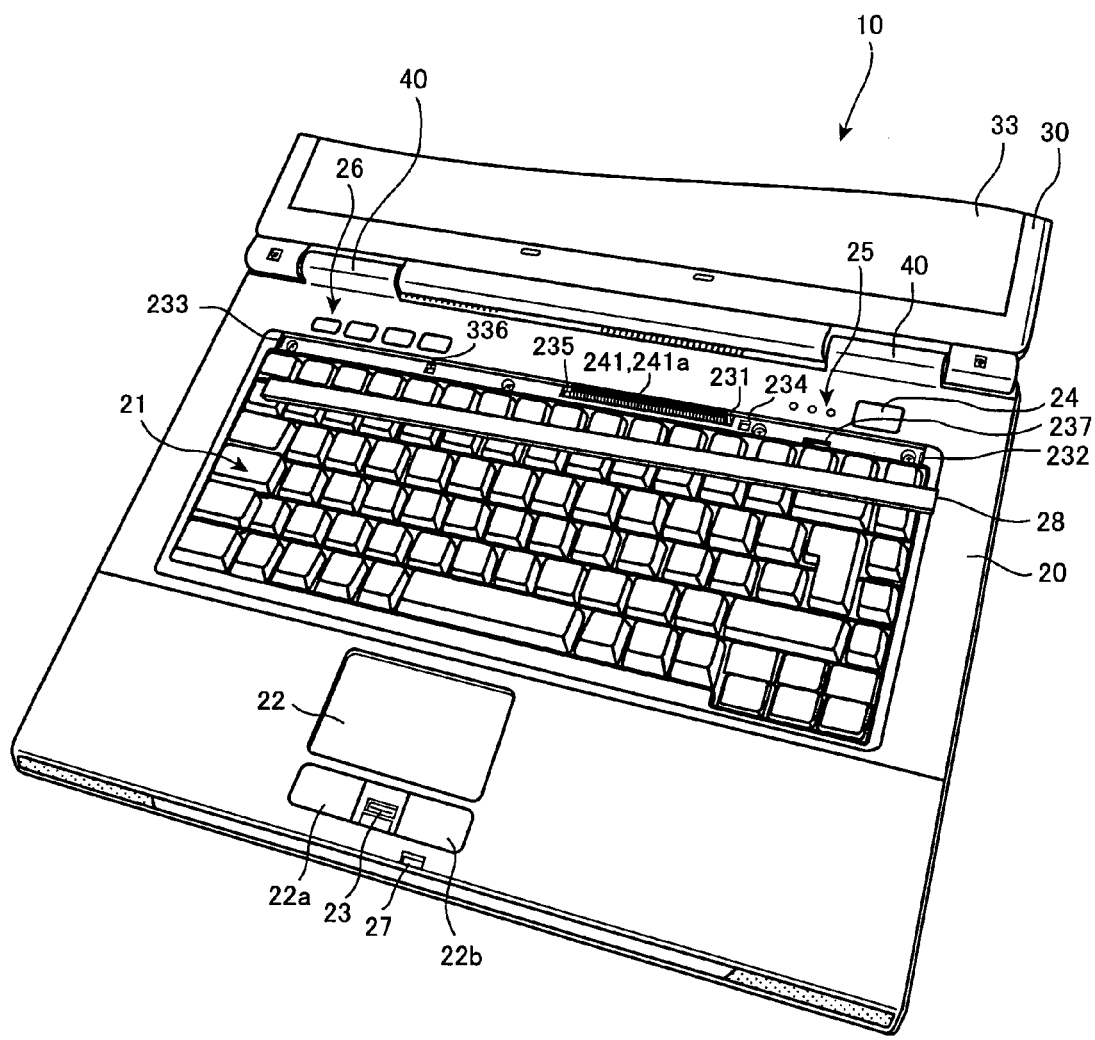
FIG. 8 shows a top face of the note PC shown in FIGS. 1 through 3 with its cover member removed therefrom.
Figure 9:
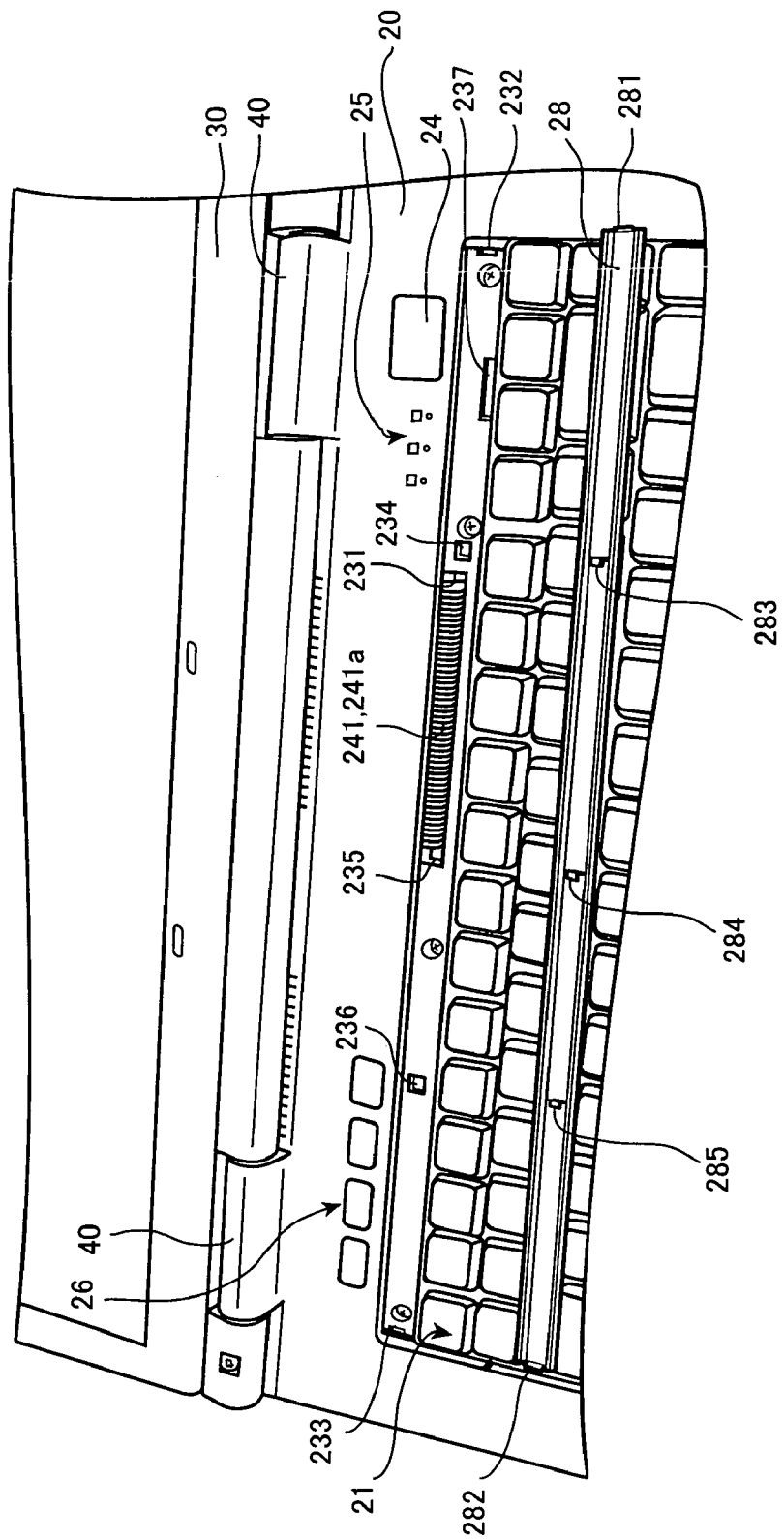
FIG. 9 is an enlarged view of a portion at the back of a keyboard on the top face of a main unit of the note PC.

FIG. 8 shows a top face of the notebook PC 10 shown in FIGS. 1 through 3 with its cover member removed therefrom. FIG. 9 is an enlarged view of a portion at the back of a keyboard 21 on the top face of the main unit 20 of the notebook PC 10.

An elongated cover member 28, as shown in FIG. 1, is disposed at the back of the keyboard 21 on the top face of the main unit 20. Opening the cover member 28 exposes an opening 231 formed inside the housing of the main unit 20. An air inlet portion 241a of the heat radiating fins 241 of the heat radiating member 240 (see FIG. 11) can be seen through the opening 231. The heat radiating member 240 will be described later in detail. The air inlet portion 241a is likely to be covered in dust because air from the fan 250 blows against it. The accumulated dust in the air inlet portion 241a prevents air flow from the fan 250, downgrading coolability, leading to rise in temperature inside the housing of the main unit 20 and thus possibly resulting in malfunction and failure of the notebook PC 10. However, the notebook PC 10 has such a configuration that the air inlet portion 241a can be exposed by taking off the cover member 28 to enable easy removal of dust accumulated therein. The opening 231, through which the air inlet portion 241a of the heat radiating fins 241 can be seen, is closed by the cover member 28, whose backside is shown in FIG. 9, which has positioning claws 281 and 282 at ends thereof and locking claws 283, 284 and 285 at three separate positions at substantially center thereof.

The positioning claws 281 and 282 engage in positioning holes 232 and 233 formed in the housing of the main unit 20 while the locking claws 283, 284 and 285 respectively engage in locking holes 234, 235 and 236 formed in the housing of the main unit 20, so that the cover member 28 is attached to the housing of the main body so as to close the opening 231.

Additionally, a recess 237 with space for a finger or a nail to be placed therein is formed in the housing of the main unit 20 in order to enable easy taking off of the cover member 28 attached to the housing. Thus, the cover member 28 can be easily taken off by placing a finger or a fingernail under the recess 237 and lifting up the cover member 28.

Figure 10:
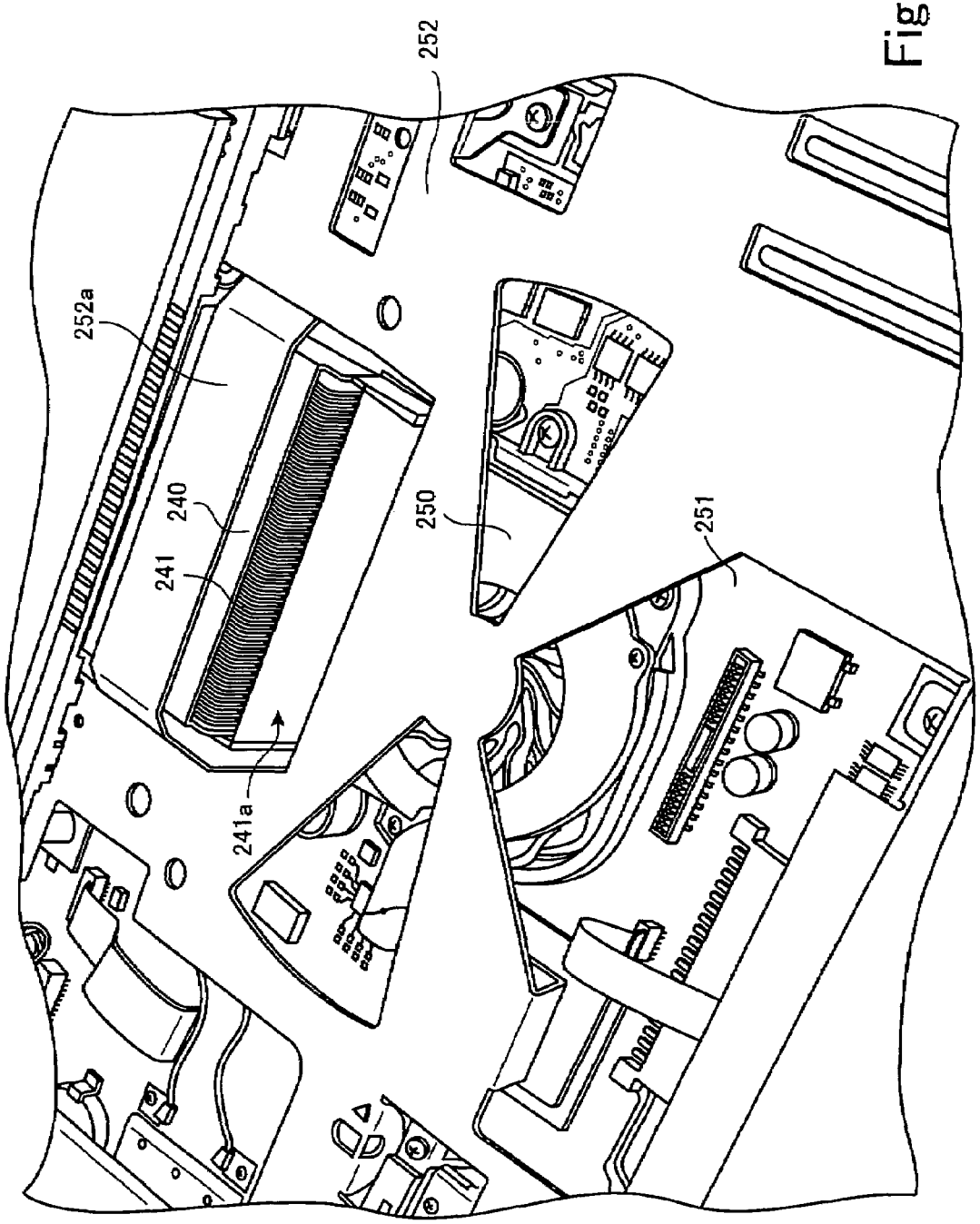
FIG. 10 illustrates a fan and a portion of a heat radiating member with a top cover and a keyboard removed from the housing of the main unit.
Figure 11:
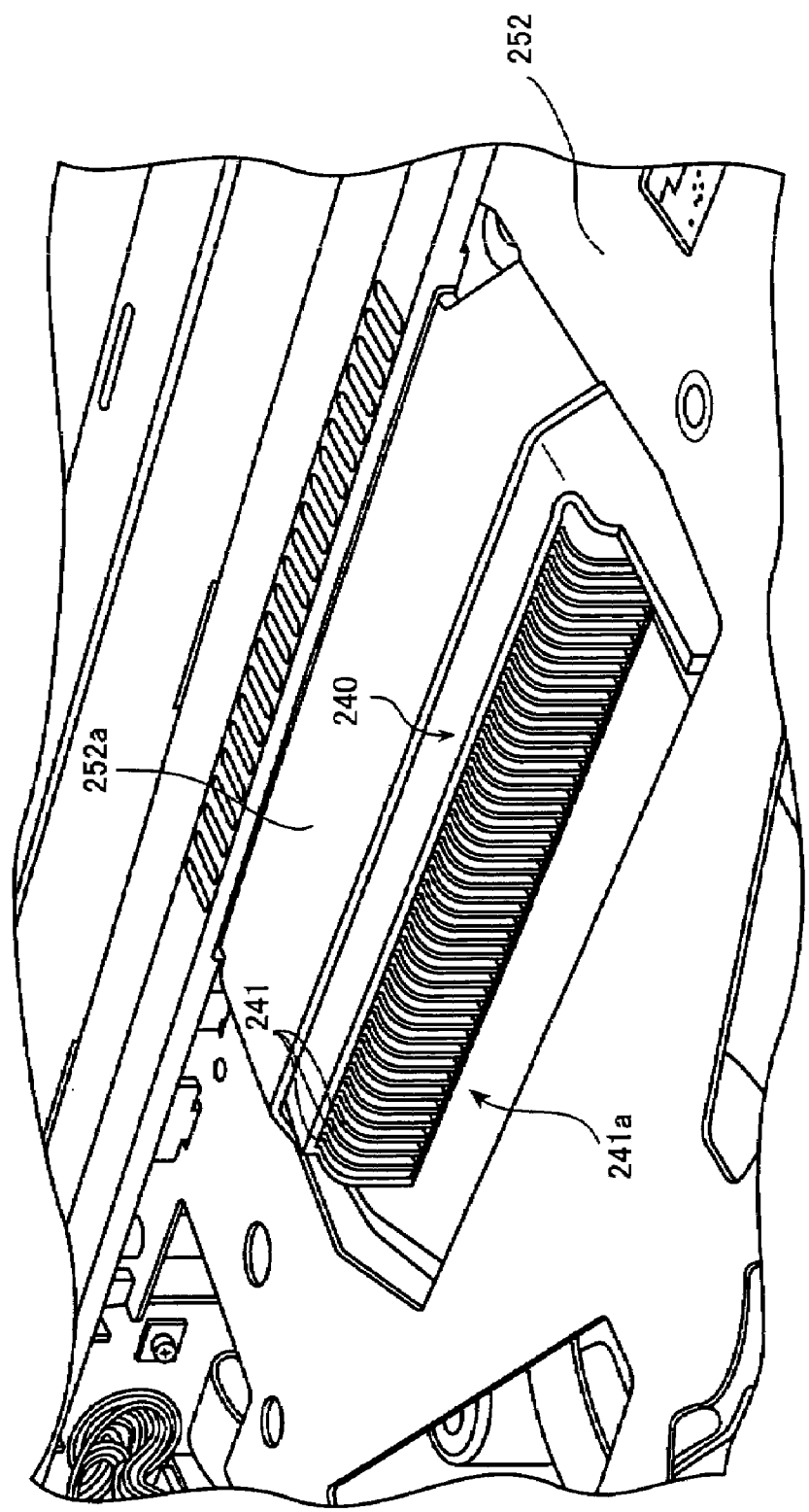
FIG. 11 illustrates the portion of the heat radiating member as viewed at different angle from that in FIG. 10.

FIG. 10 illustrates a fan and a portion of the heat radiating member 240 with a top cover and the keyboard 21 of the main unit 20 removed therefrom. FIG. 11 illustrates the portion of the heat radiating member 240 as viewed at different angle from that in FIG. 10.

A main circuit board 251 mounted with various circuit components is arranged around the fan 250. A metal plate 252 with several holes formed therein is arranged above the fan 250, the main circuit board 251, and the heat radiating member 240. A top face of the heat radiating member 240 stands higher than that of the fan 250, so that a shield portion 252a formed in the metal plate 252 for covering the top face of the heat radiating member 240 is raised from the level of the rest of the metal plate 252.

The metal plate 252 serves as an electromagnetic shield as well as a base for the keyboard 21 (see FIG. 1) that is arranged on the metal plate 252.

Figure 12:
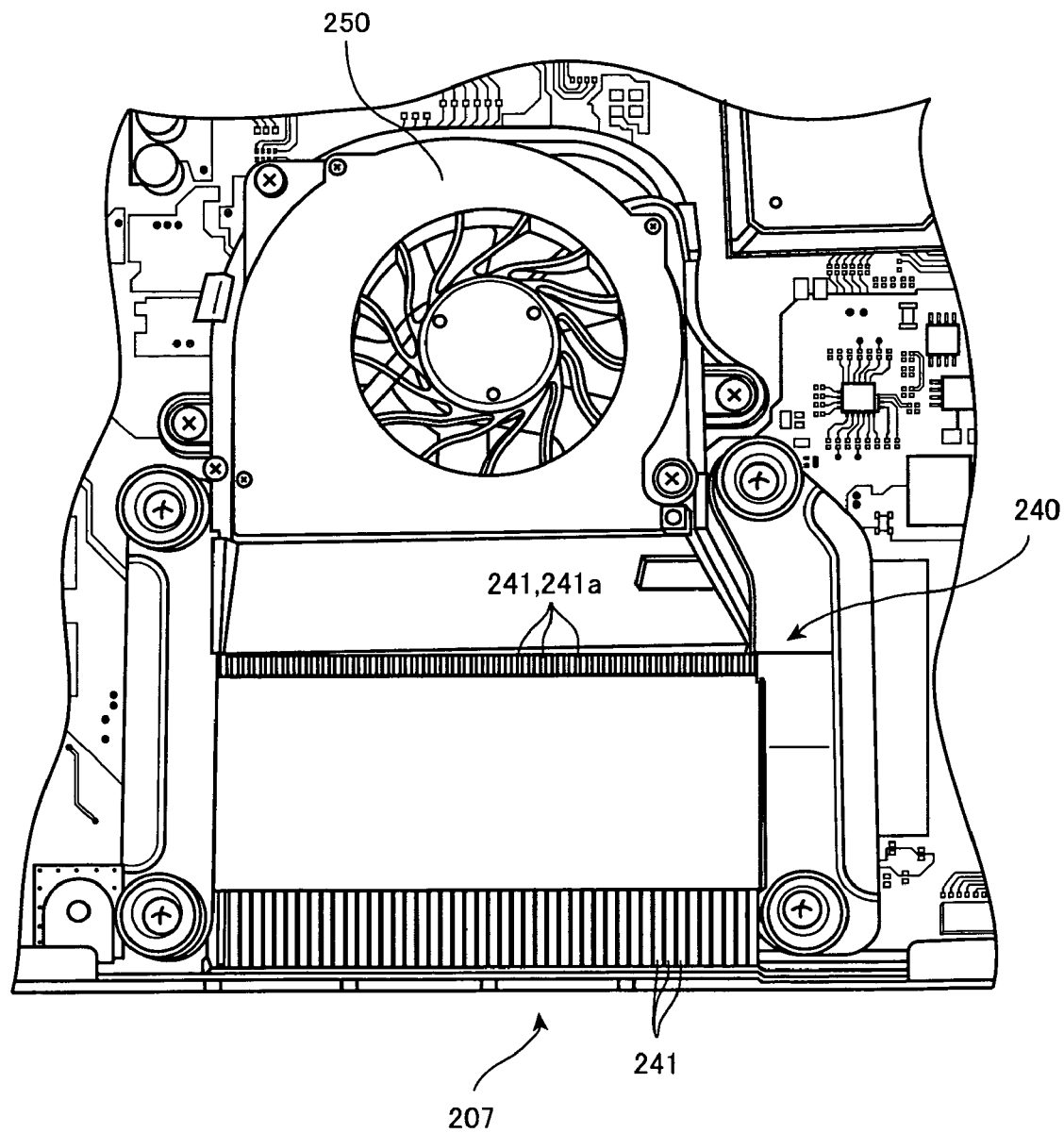
FIG. 12 shows a positional relationship between the fan and the heat radiating member with a metal plate removed therefrom.
Figure 13:
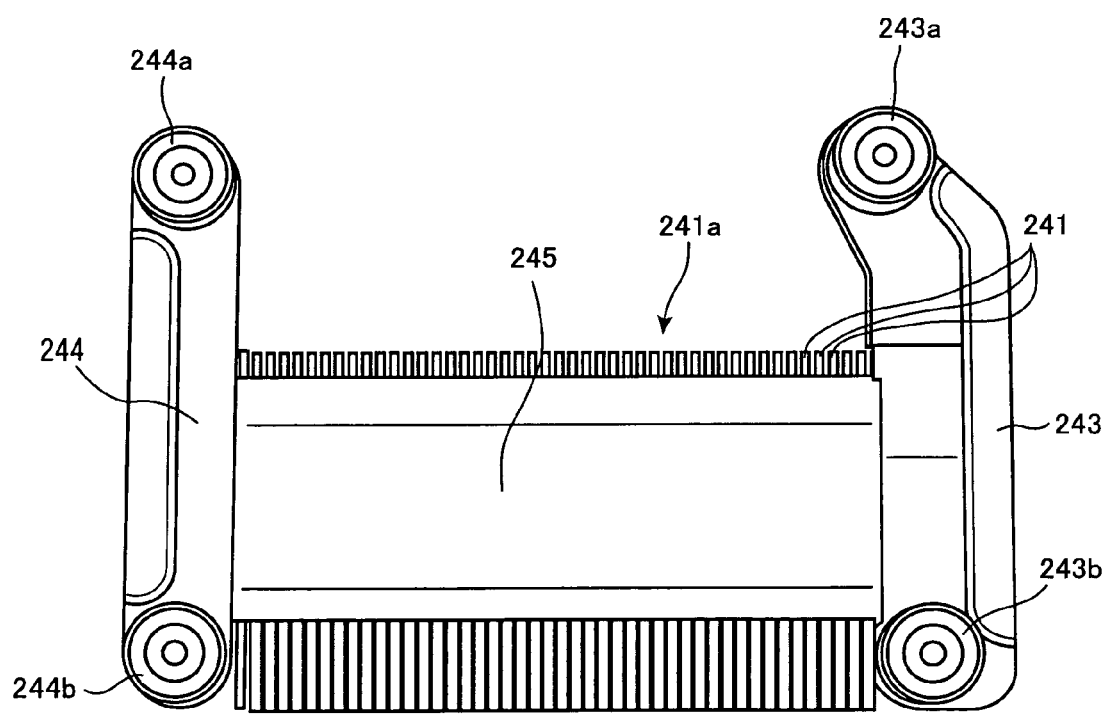
FIG. 13 is a plane view of the heat radiating member.

FIG. 12 shows a positional relationship between the fan 250 and the heat radiating member 240 with the metal plate 252 removed therefrom.

Two kinds of LSIs, that is, what is called CPU and chipset are disposed under the heat radiating member 240. The heat radiating member 240 serves for radiating heat generated by the two LSIs, which will be described later in detail.

Air blown from the fan 250 enters the air inlet portion 241a to reach the heat radiating fins 241 and then is warmed up while passing between the heat radiating fins 241 by absorbing heat therefrom and exits from the air outlets 207 (also see FIG. 5) formed in the flank of the back of the main unit 20.

(Structure of Heat Radiating Member)

The heat radiating member 240 includes a flat base section (hereafter referred to as "a base plate") 242, the multiple pieces of radiating fins 241 that are fixed to and stand on the base plate 242 and a pair of arms (hereafter referred to as "arm plates") 243, 244 that extend horizontally at both ends of the base plate 242. The arm plates 243, 244 include fasteners 243a, 243b, and 244a, 244b respectively disposed at the front and the back thereof for fastening the heat radiating member 240 with screws. Additionally, the heat radiating member 240 has a fixed section (hereafter referred to as "a fixed plate") 245 that stands at both ends of the heat radiating fins 241 and links the both ends by extending over the heat radiating fins 241 like a bridge. The pair of arm plates 243, 244 are formed by extending the fixed plate 245.

The manufacturing process of the heat radiating member 240 is as follows: solder is applied to the bottom of each of the heat radiating fins 241 to place them on the top face of the base plate 242; then, solder is applied to the top of each of the heat radiating fins 241 to attach the heat radiating fins 241 and the base plate 242 to the fixed plate 245, which are subjected to solder-joint with a furnace to complete manufacturing.

Incidentally, the fasteners 243a, 234b, and 244a, 244b respectively have a structure of a fixed pedestal with a spring incorporated therein. Thus, the heat radiating member 240 is pressed against heat radiating components by means of springs when fastened with screws. Such a structure is well known art and thus further explanation is omitted.

Figure 15:
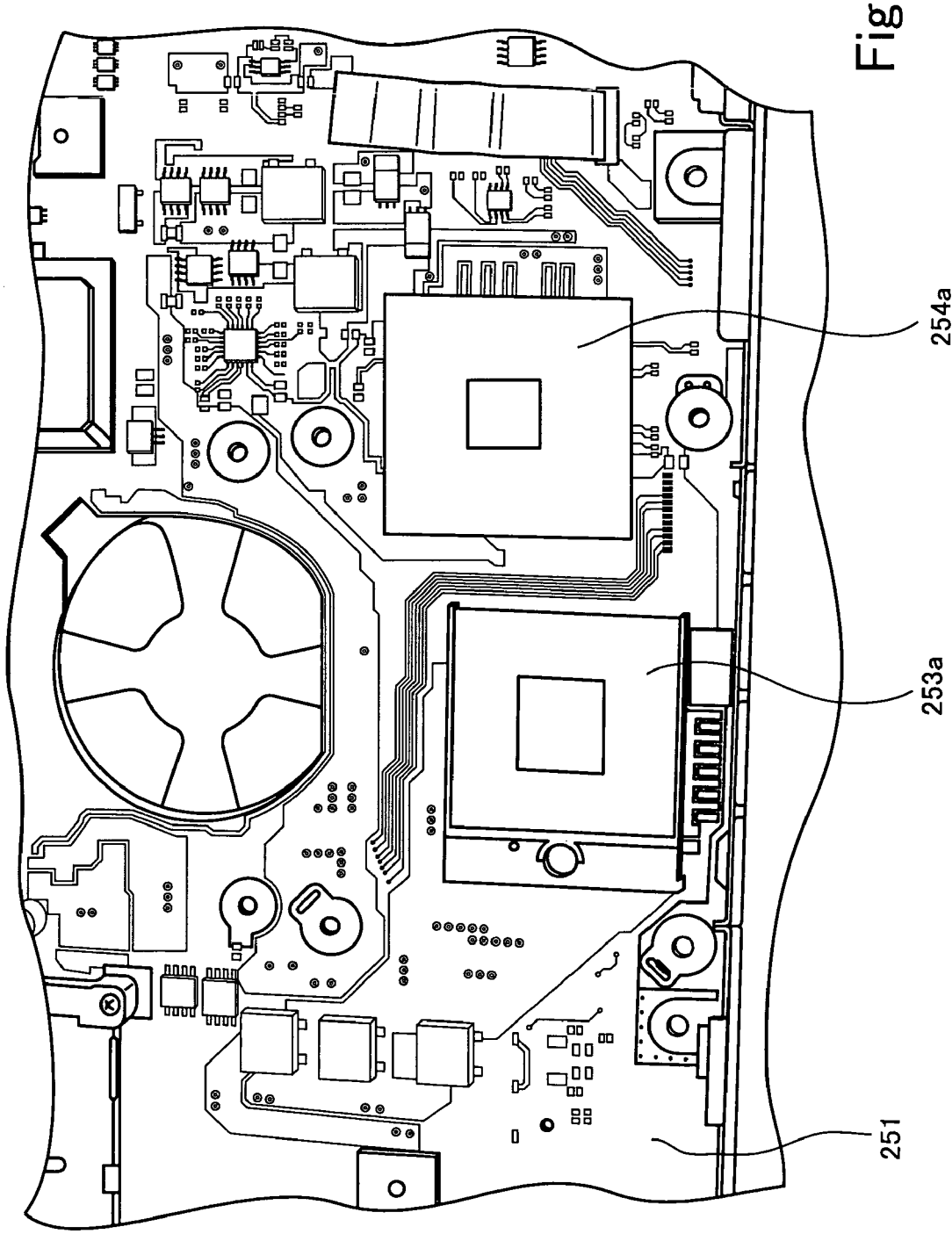
FIG. 15 shows heat generating components on a main circuit board.

FIG. 15 shows heat generating components on the main circuit board 251.

Figure 14:
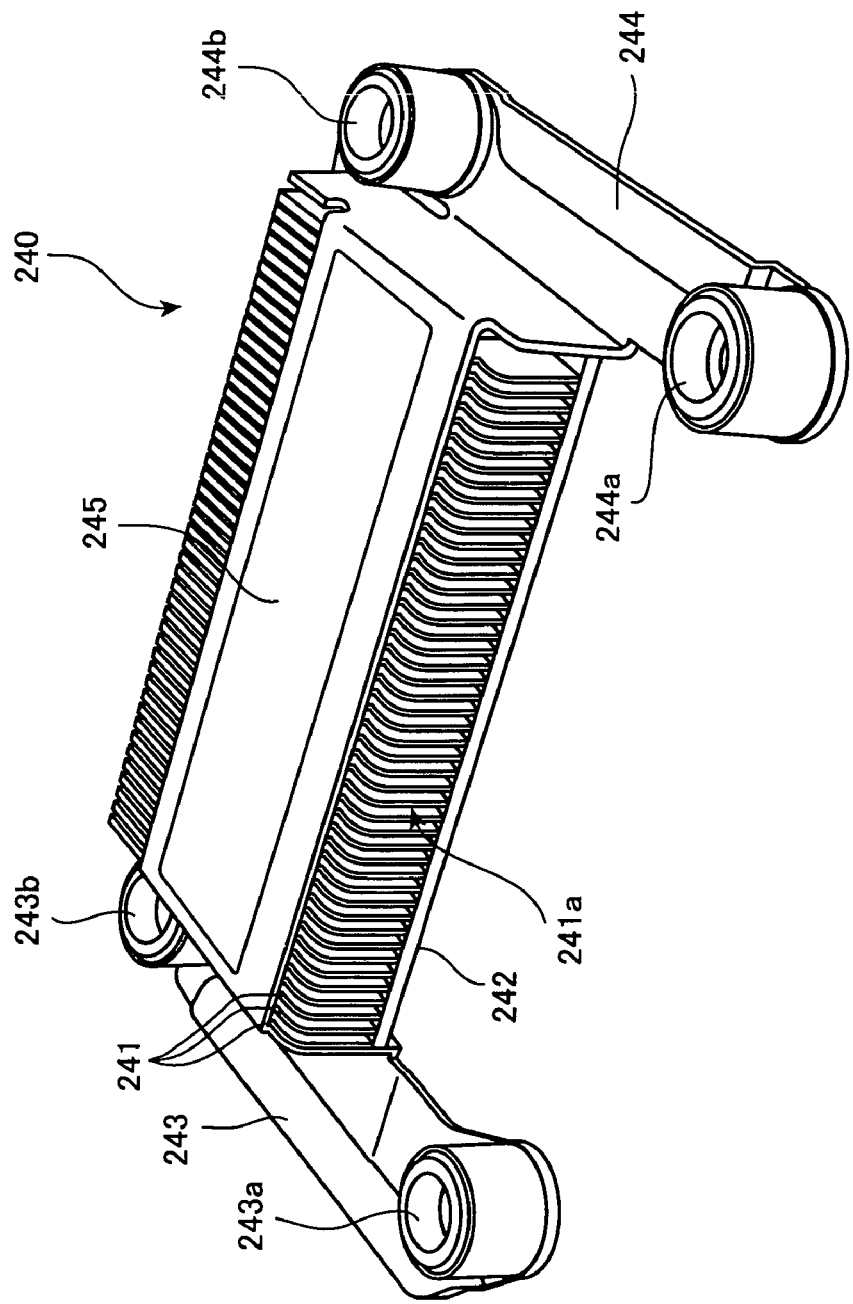
FIG. 14 is a perspective view of the heat radiating member.

FIG. 15 illustrates CPU 253a and chipset 254a disposed near the CPU 253a that are heat generating components to be cooled by the heat radiating member 240 shown in FIG. 14. As the CPU 253a generates larger amount of heat than the chipset 254a, it is placed so as to be efficiently cooled by the heat radiating member 240. More particularly, the CPU 253a is disposed under the base plate 242, so that heat generated by the CPU 253a is conducted via the base plate 242 to the heat radiating fins 241 from the bottom thereof. On the other hand, the chipset 254a is disposed under one of arm plates 243, 244 (in this case the arm plate 243), so that heat generated by the chipset 254a is conducted via the fixed plate 245 to the heat radiating fins 241 from the top thereof.

Figure 16:
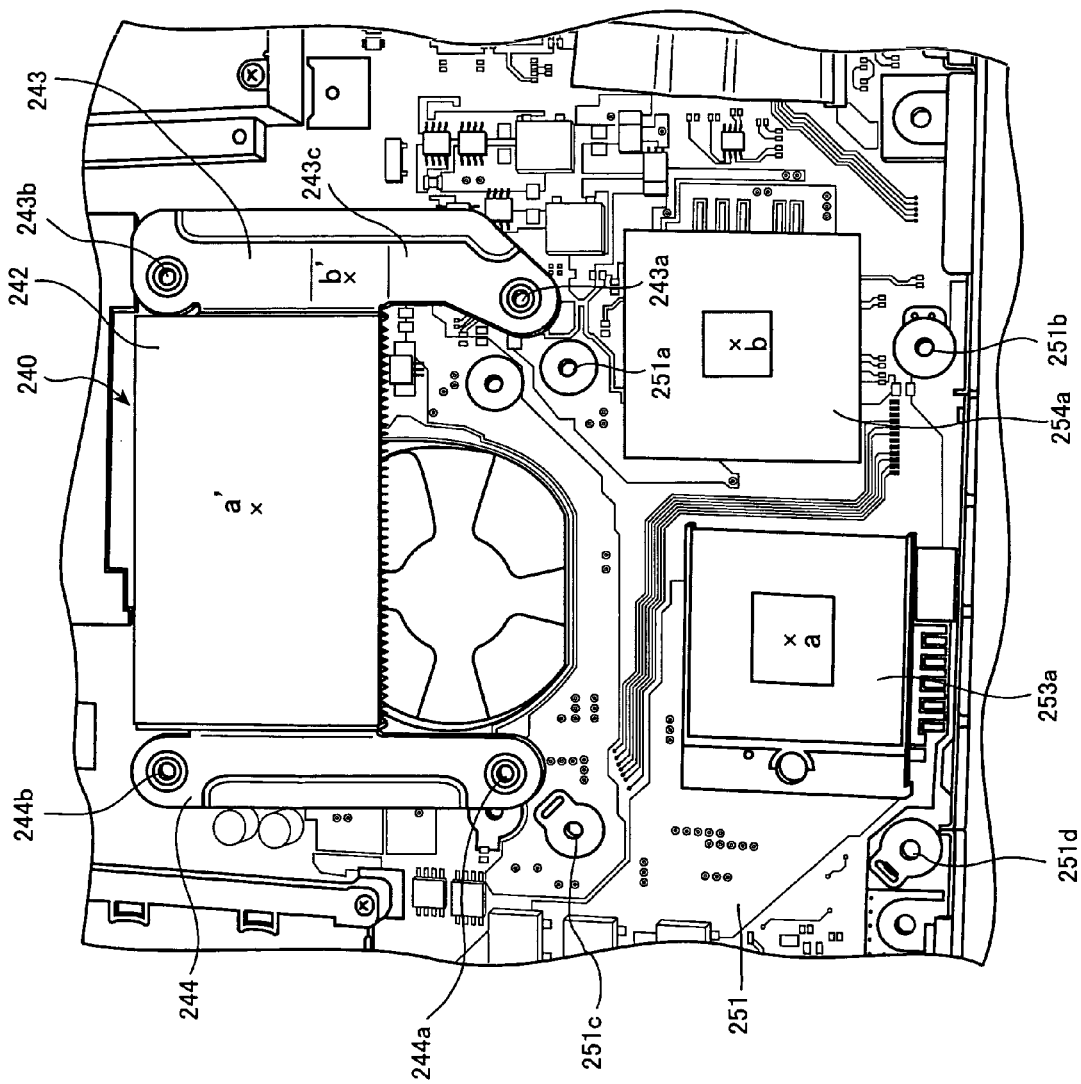
FIG. 16 illustrates two heat generating components and a bottom face of the heat radiating member that contacts the heat generating components.

FIG. 16 illustrates two heat generating components, that is, the CPU 253a and the chipset 254a, and a bottom face of the heat radiating member 240 that contacts the heat generating components.

The heat radiating member 240 is arranged on the CPU 253a and the chipset 254a so as to be in contact with them via thermal grease. When the heat radiating member 240 is attached to the CPU 253a and the chipset 254a by screwing the fasteners 243a, 243b and 244a, 244b of the arm plates 243, 244 in the four respective holes 251a, 251b and 251c, 251d formed in the main circuit board 251, a substantial center "a" of the CPU 253a contacts a substantial center "a'" of the base plate 242 of the heat radiating member 240, while a substantial center "b" of the chipset 254a contacts a substantial center "b'" having a downward projection of the arm plate 243. The downward projection of the arm plate 243 will be described later in detail.

Figure 17:
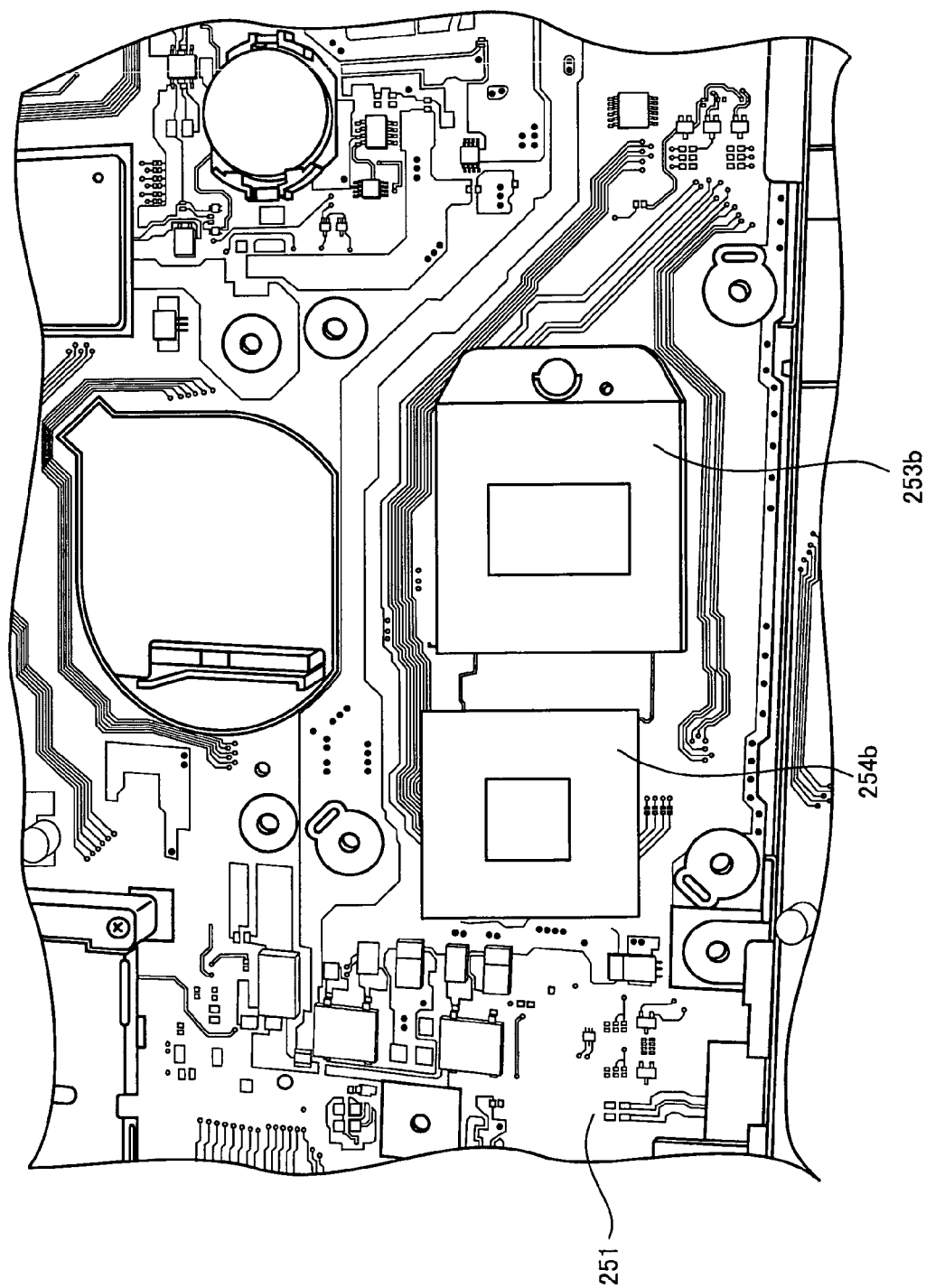
FIG. 17 shows positional relation between a CPU and a chipset different from that shown in FIGS. 15 and 16.

FIG. 17 show positional relation between a CPU and a chipset different from that shown in FIGS. 15 and 16

The notebook PC 10 according to the embodiment (see FIG. 1) includes two kinds of notebook PCs mounted with two kinds of CPUs and chipsets of different manufacturers. FIGS. 15 and 16 show positional relation between CPU 253b and chipset 254b of a first kind of the notebook PCs while FIG. 17 shows that of a second kind of the notebook PC.

The difference of positional relation between the CPU 253b and the chipset 254b between FIGS. 15, 16 and FIG. 17 lies in that the position of the CPU 253a is roughly replaced with the chipset 254a.

Figure 18:
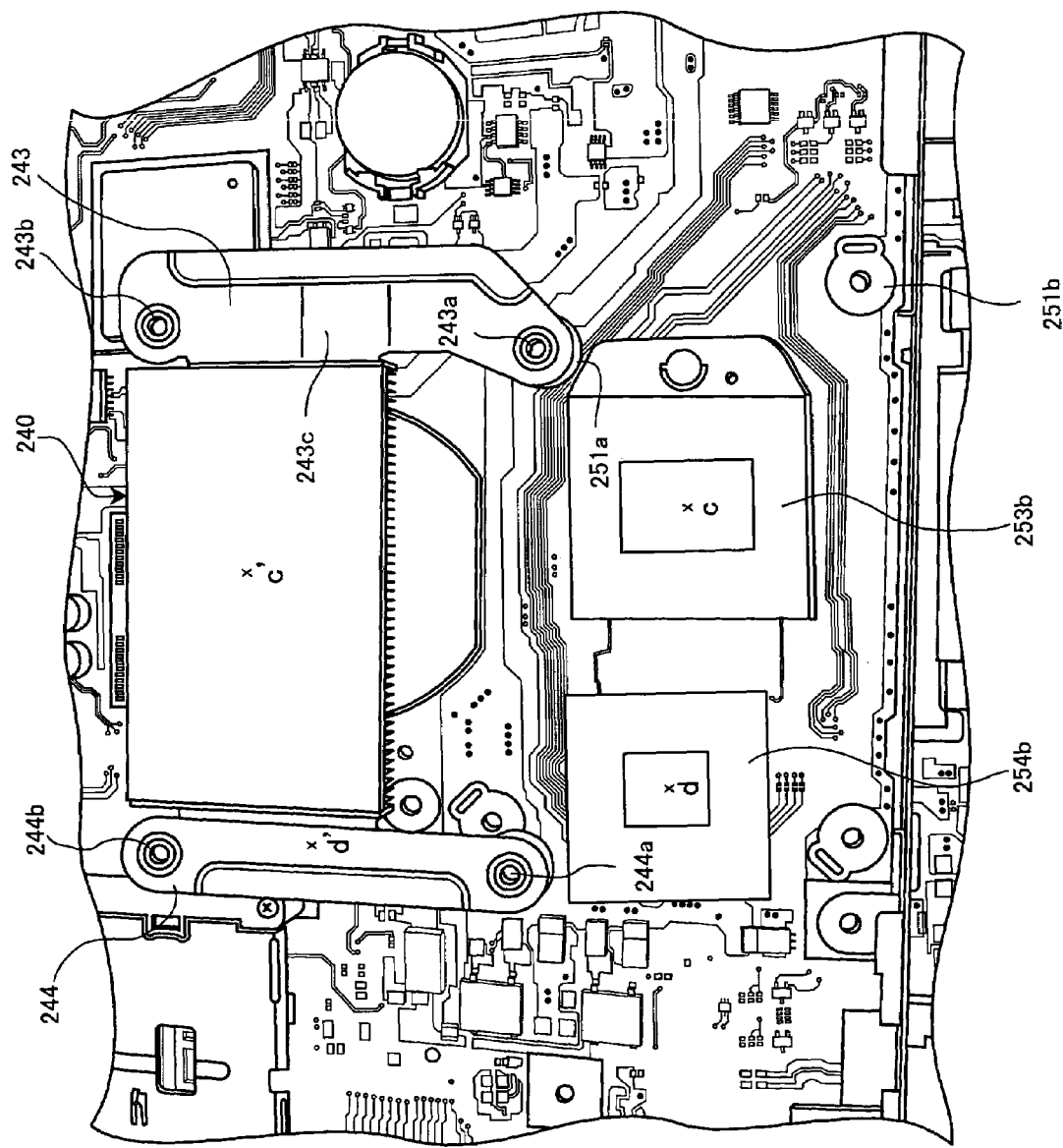
FIG. 18 illustrates two heat generating components, that is, the CPU and the chipset, and a bottom face of the heat radiating member that contacts the heat generating components.

FIG. 18 illustrates two heat generating components, that is, the CPU 253b and the chipset 254b, and a bottom face of the heat radiating member that contacts the heat generating components.

Similarly to the notebook PC 10 shown in FIG. 16, the heat radiating member 240 is arranged on the CPU 253b and the chipset 254b so as to be in contact with them via thermal grease. When the heat radiating member 240 is attached to the CPU 253b and the chipset 254b by screwing the fasteners 243a, 243b and 244a, 244b of the arm plates 243, 244 in the four respective holes 251a, 251b and 251c, 251d formed in the main circuit board 251, a substantial center "c" of the CPU 253b contacts a substantial center "c'" of the base plate 242 of the heat radiating member 240, while a substantial center "d" of the chipset 254b contacts a substantial center "c'" of the arm plate 244.

The height of the chipset 254a with reference to that of the CPU 253a, in the first kind of the notebook PC shown in FIG. 16, differs from the height of the chipset 254b with reference to that of the CPU 253b in the second kind of the notebook PC shown in FIG. 18. That is why the arm plate 243 constituting the heat radiating member 240 has the downward projection 243c to offset difference in height between the chipsets 254a and 254b so that the heat radiating member 240 can contact both the chipsets 254a and 254b.

According to the embodiment, the heat radiating member 240 has such a structure that difference in height between the CPU 253a and 253b is offset by the amount of contraction and extension of the springs of the fasteners 243a, 243b and 244a, 244b, while difference in height between the chipsets 254a and 254b is offset by the shape of the arm plate 243.

Such a structure enables the heat radiating member 240 of the same shape to be used for the two kinds of notebook PCs, by aligning the holes 251a, 251b and 251c, 251d formed in the main circuit board 251 of the notebook PC 10 with the fasteners 243a, 243b and 244a, 244b of the arm plates 243, 244 of the heat radiating member 240.

(Structure of Hard Disc Drive Unit Loading Opening Portion)

Figure 19:
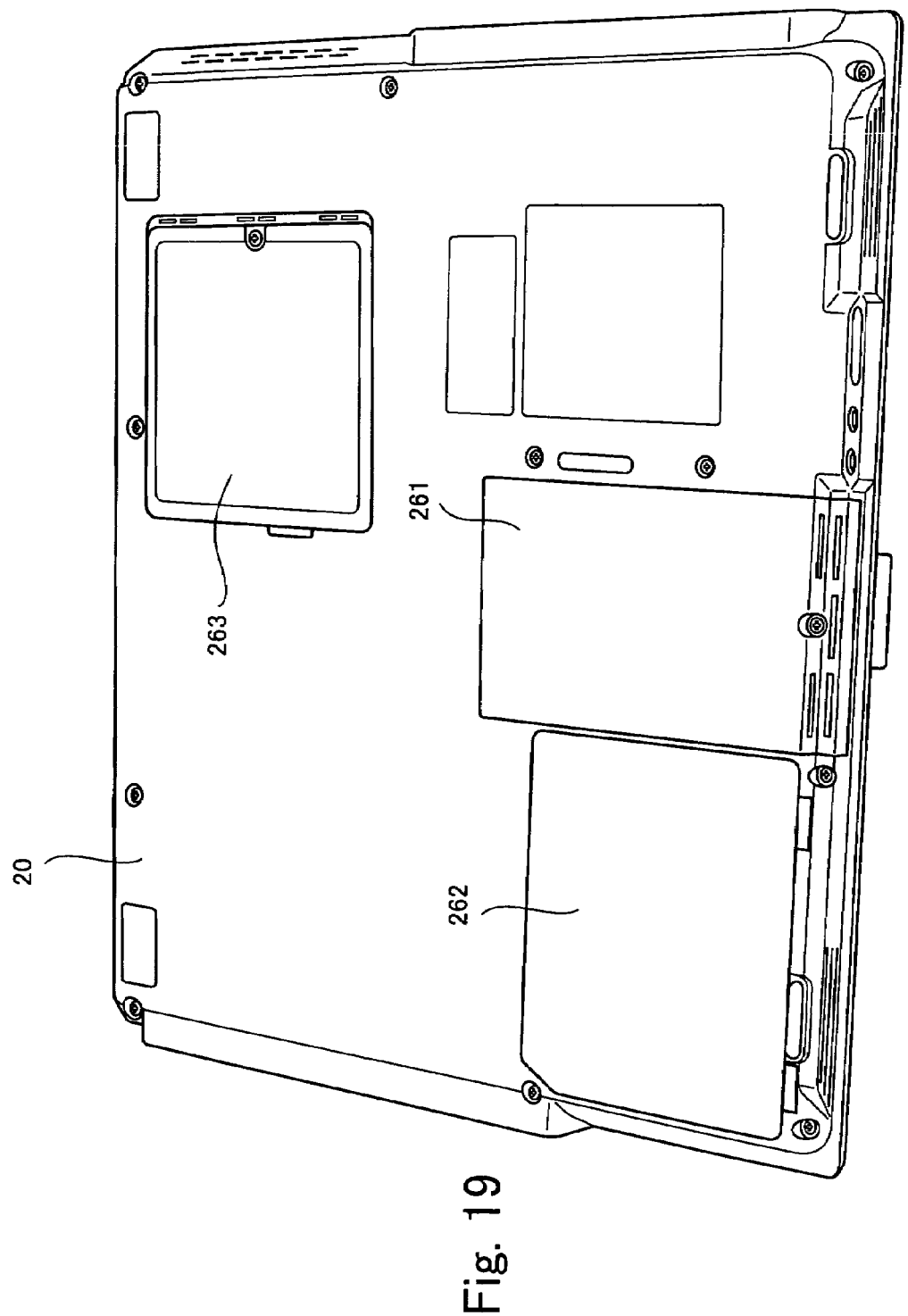
FIG. 19 is a perspective view of a bottom face of the main unit of the notebook PC.

FIG. 19 is a perspective view of a bottom face of the main unit 20 of the notebook PC 10.

FIG. 19 shows a cover member 261 for closing the hard disc drive unit loading opening, a cover member 262 for closing a battery loading opening and a cover member 263 for closing a memory card loading opening.

Figure 20:
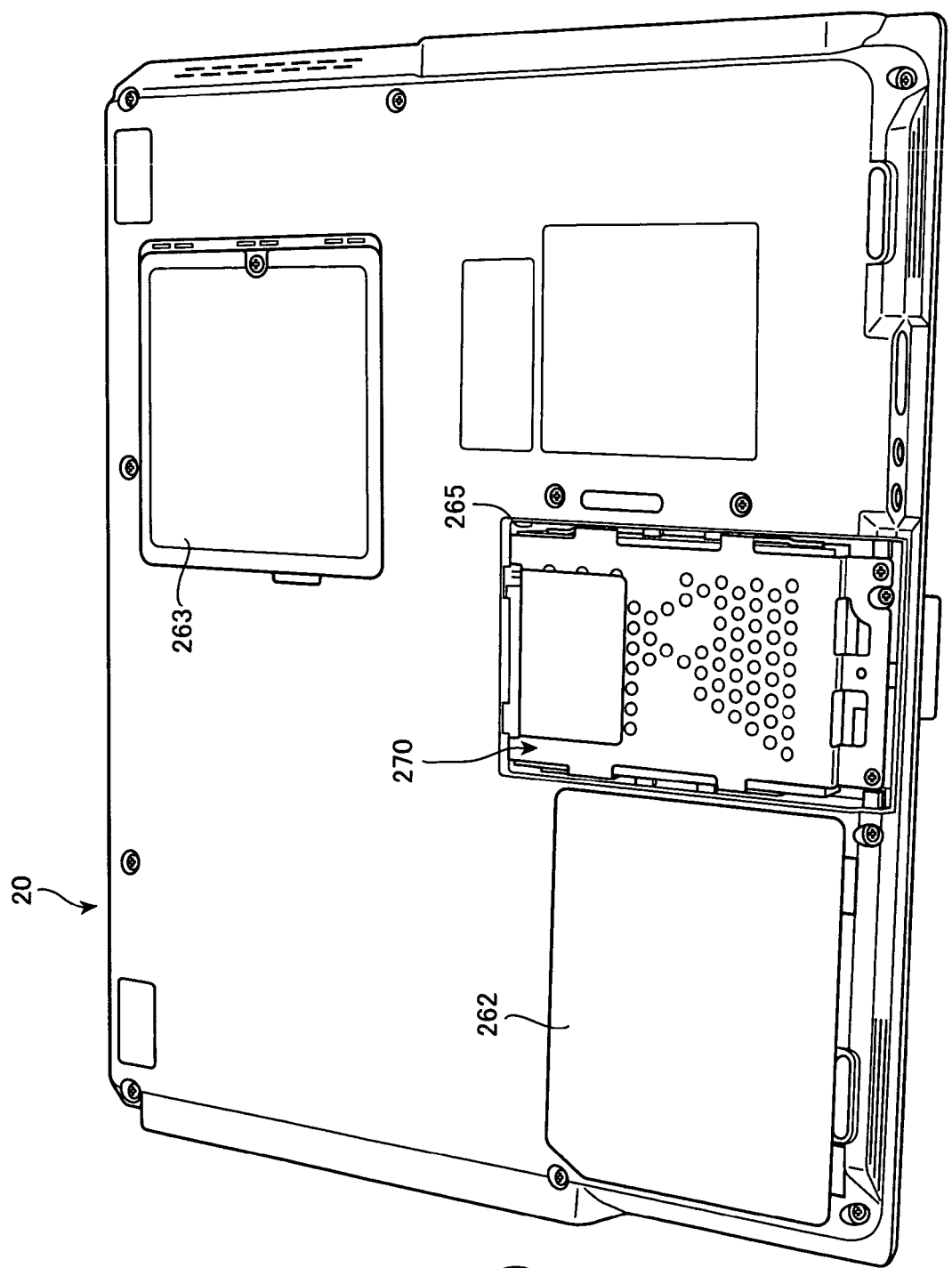
FIG. 20 shows the bottom face of the main unit of the notebook PC shown in FIG. 19, with the cover member for closing a hard disc drive unit loading opening removed therefrom.

FIG. 20 shows the bottom face of the main unit 20 of the notebook PC shown in FIG. 19, with the cover member 261 for closing the hard disc drive unit loading opening removed therefrom.

As shown in FIG. 20, an opening 265 for housing a hard disc drive unit 270 is formed in the bottom face of the main unit 20 and the hard disc drive unit 270 is housed therein.

Figure 21:
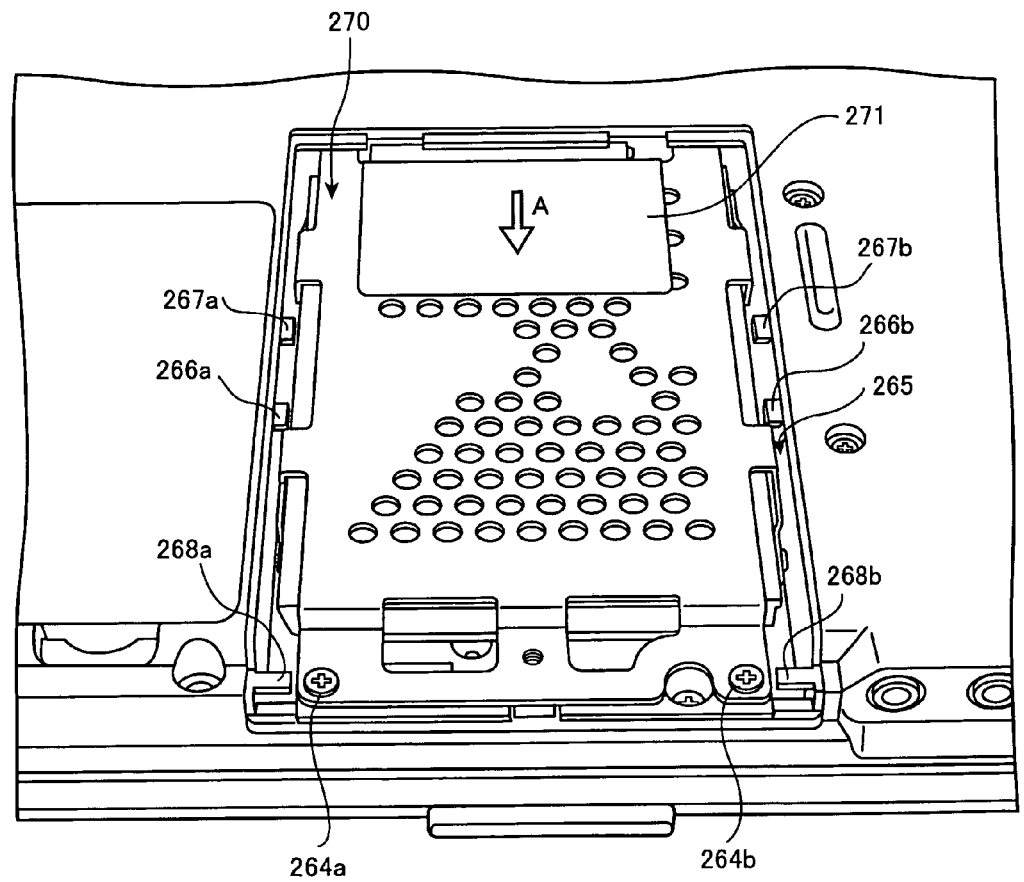
FIG. 21 is an enlarged view of an opening for accommodating the hard disk drive unit and the hard disc drive unit housed therein.

FIG. 21 is an enlarged view of the opening 265 and the hard disc drive unit 270 housed therein.

In order to remove the hard disc drive unit 270 from the opening 275, two screws 264a and 264b are first to be disengaged to pull a sheet 271 in the direction indicated by the arrow A, thereby disengaging a unit side connector 273 (see FIG. 22), which will be described later. Then, the hard disc drive unit 270 is ready to be removed from the opening 275. Alternatively, in order to house the hard disc drive unit 270 in the opening 275, the hard disc drive unit 270 is first to be placed on a position little displaced from the position indicated by FIG. 21 toward the direction indicated by the arrow A. Then, pressing the hard disc drive unit 270 in the direction opposite the direction indicated by the arrow A causes the unit side connector 273 to be engaged and then, by screwing the hard disc drive unit 270 with the two screws 264a and 264b, the hard disc drive unit 270 is appropriately housed in the opening 265.

It should be noted that the opening 265 has a pair of projections 266a and 266b projecting inside and disposed at both sides thereof. The projections 266a and 266b interfere with the hard disc drive unit 270, if the unit side connector 273 is to be engaged while the back end (opposite the unit side connector 273) of the hard disc drive unit 270 is lifted obliquely or the whole of the hard disc drive unit 270 is lifted from the level of the opening 265. Thus, the projections 266a and 266b prevent wrong connection of the unit side connector 273 and failures such as bent back connector pins. Additionally, the opening 265 has projections 267a, 267b, and 268a, 268b disposed at both sides thereof that serve for engaging the cover member 261 (see FIGS. 19 and 31) for the opening 265.

Figure 22:
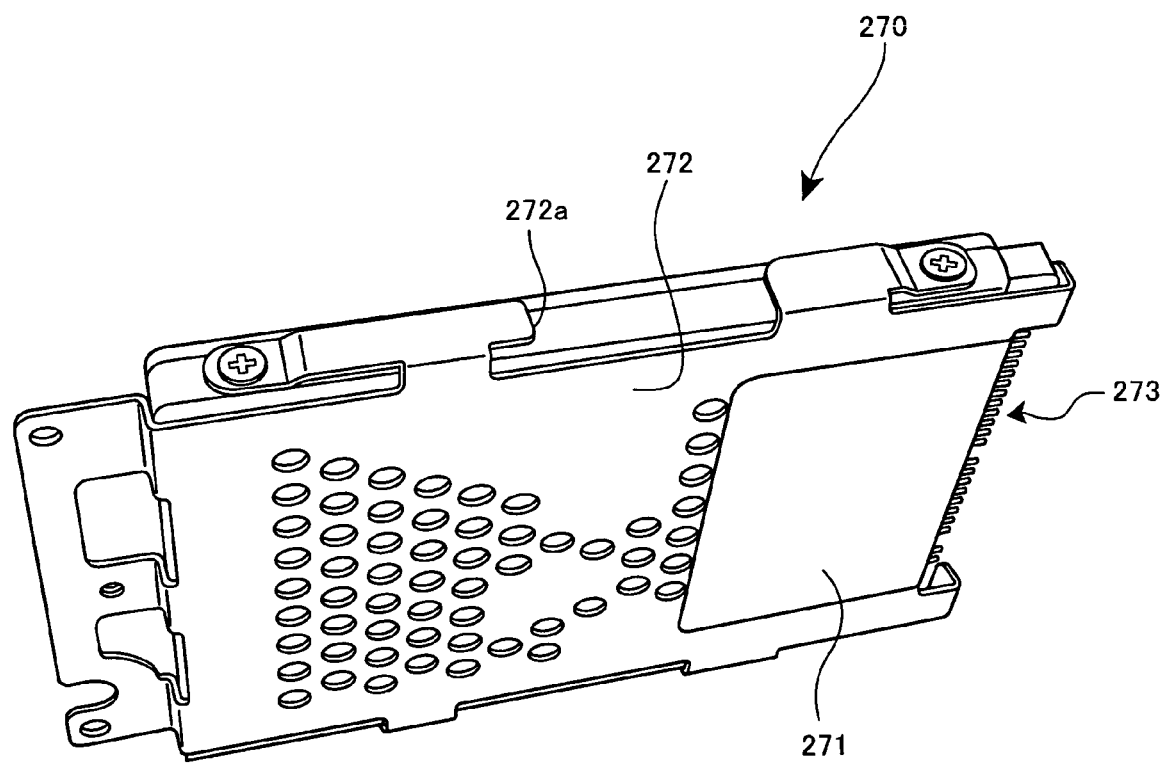
FIG. 22 is a view of the hard disk drive unit as viewed at a certain angle.
Figure 23:
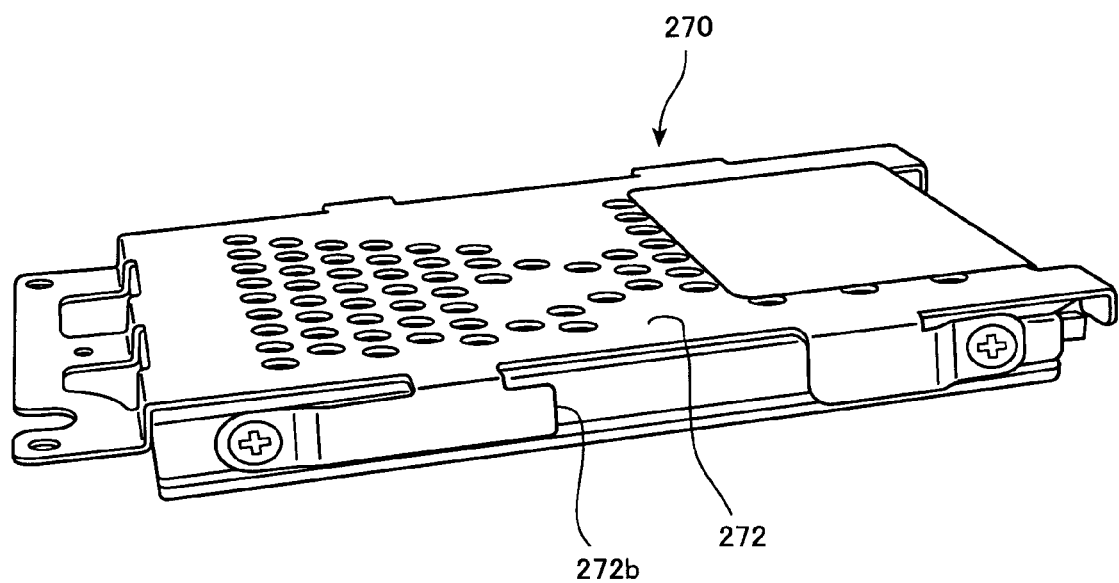
FIG. 23 is a view of the hard disk drive unit as viewed at a different angle.
Figure 24:
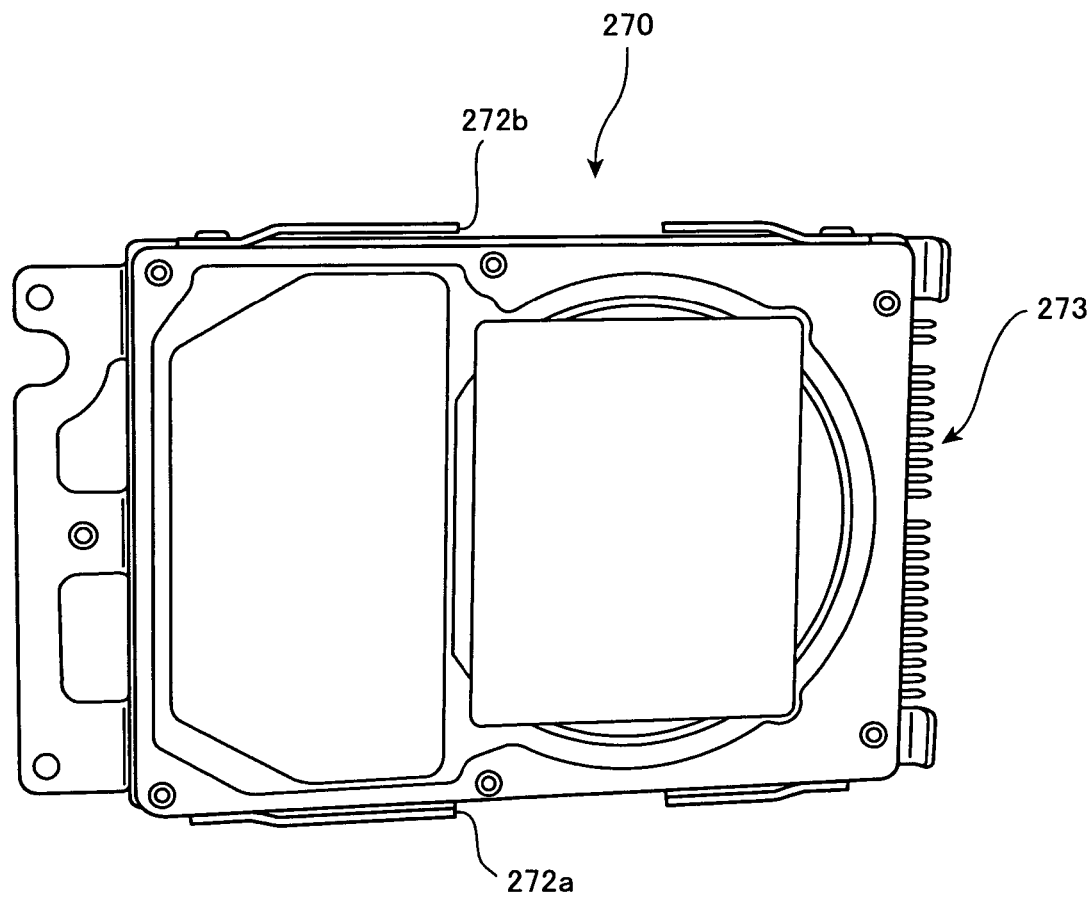
FIG. 24 is a view of the hard disk drive unit as viewed at another different certain angle.
Figure 25:
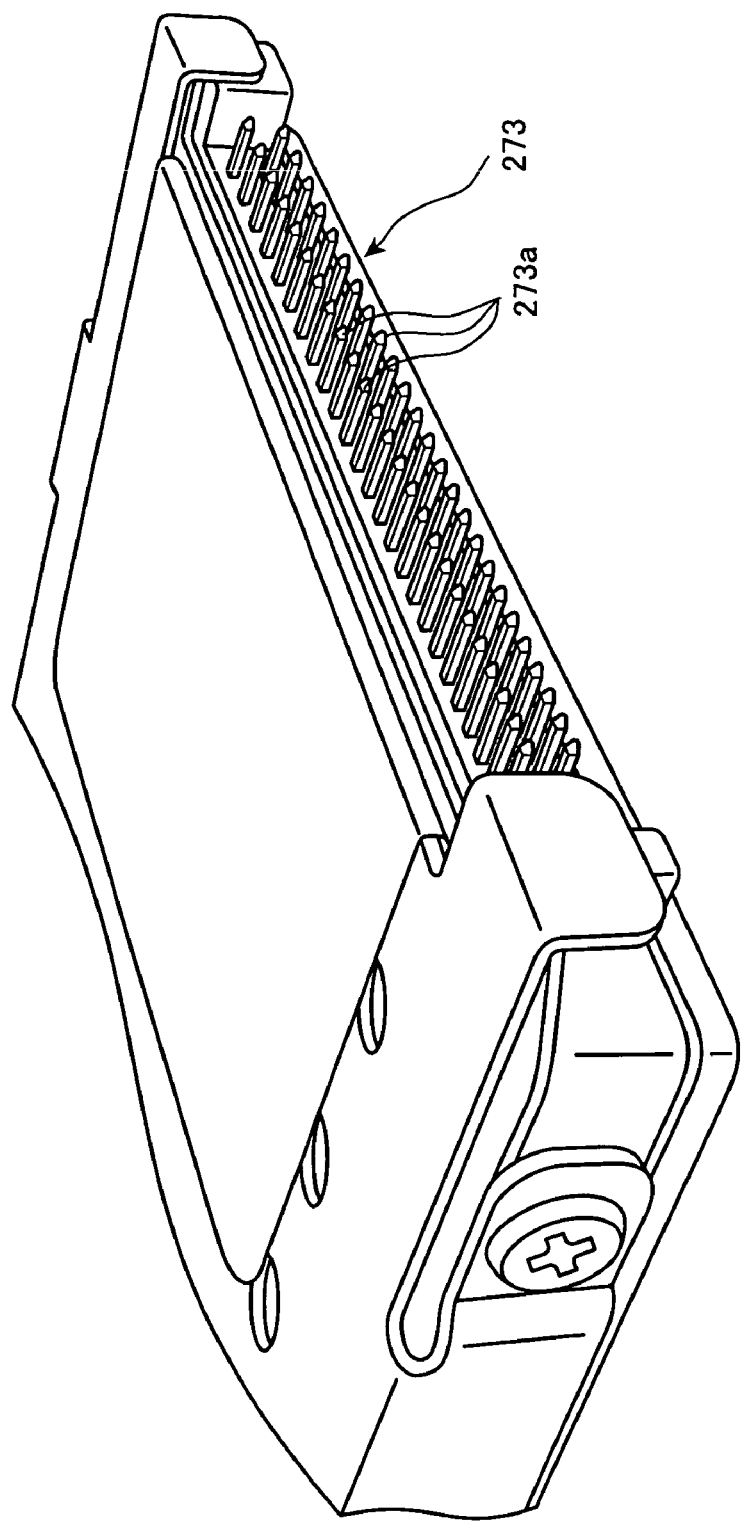
FIG. 25 is a perspective view of a unit side connector provided in the hard disc drive unit.

FIGS. 22 through 24 illustrate the hard disc drive unit 270 as viewed from different angles from that in FIG. 21. FIG. 25 is a perspective view of the unit side connector 273 provided in the hard disc drive unit 270.

As shown in FIGS. 22 through 24, the hard disc drive unit 270 is provided with a metal frame 272 that is fastened to the hard disc drive unit 270 with screws in the side portions thereof that are formed by extending the metal frame 272 and bending it at the both edges. The metal frame 272 serves for maintaining strength of the hard disc drive unit 270 as well as shielding electromagnetic force of its internal hard disc and magnetic disc. Multiple holes formed in the metal frame 272 are intended for reduction in weight while maintaining strength and shielding performance.

Additionally, the metal frame 272 also serves for preventing wrong engagement of the unit side connector 273. When the unit side connector 273 is to be engaged while the hard disc drive unit 270 is in undesired postures, for example, lifted obliquely as described above, interfering sections 272a and 272b of the metal frame 272 interfere with the projections 266a and 266b of the opening 265.

Further, the hard disc drive unit 270 is provided with the unit side connector 273 at the front end thereof. As shown in FIG. 25, the unit side connector 273 has multiple connection pins 273a aligned in two rows.

Figure 26:
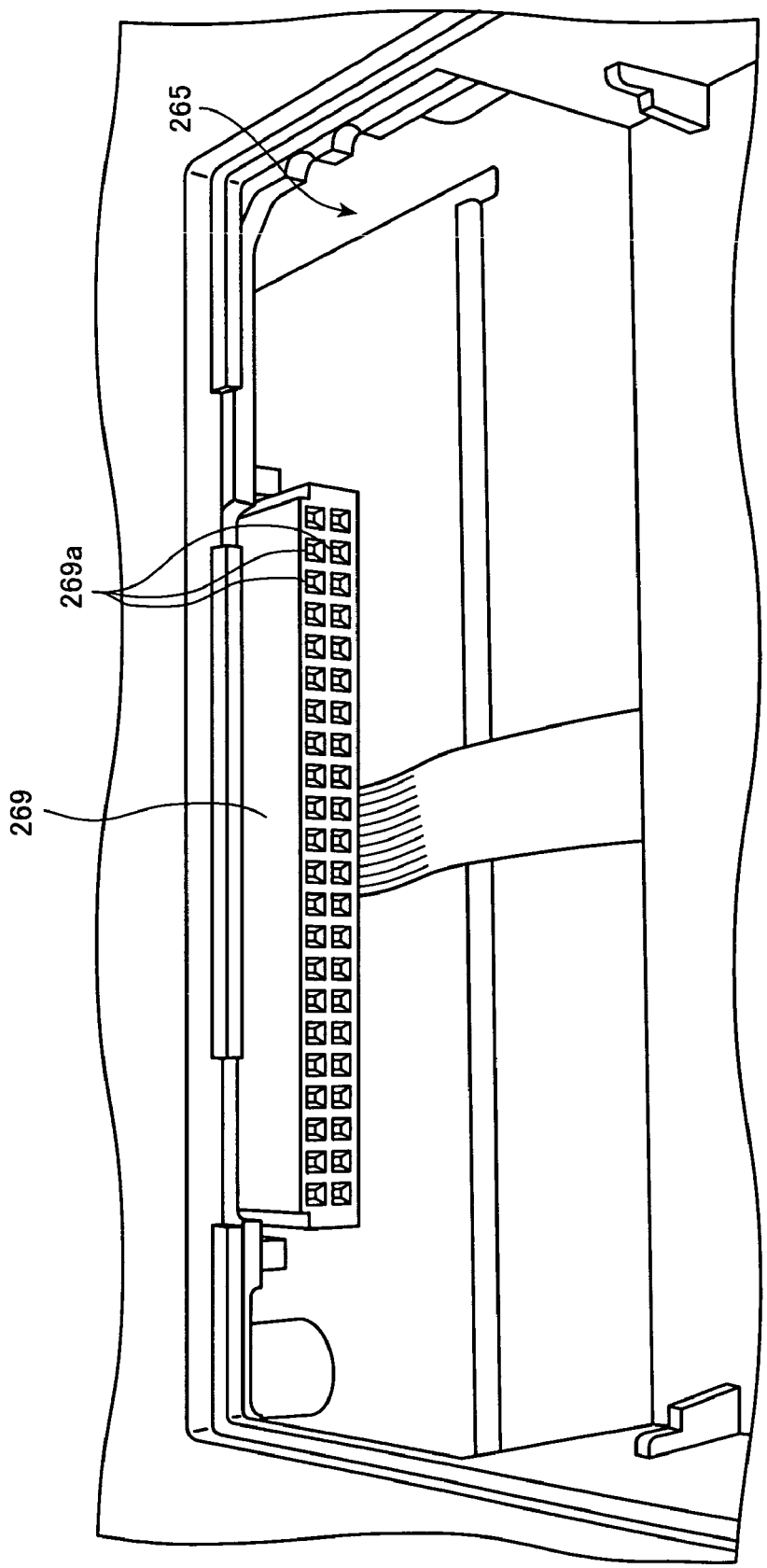
FIG. 26 shows an apparatus side connector that is to be connected with the unit side connector provided in the hard disc drive unit.

FIG. 26 shows an apparatus side connector 269 that is to be connected with the unit side connector 273 provided in the hard disc drive unit 270.

The apparatus side connector 269 has multiple pin insertion holes 269a aligned in two rows to receive the corresponding connection pins 273a aligned in two rows of the unit side connector 273 provided in the hard disc drive unit 270.

Figure 27:
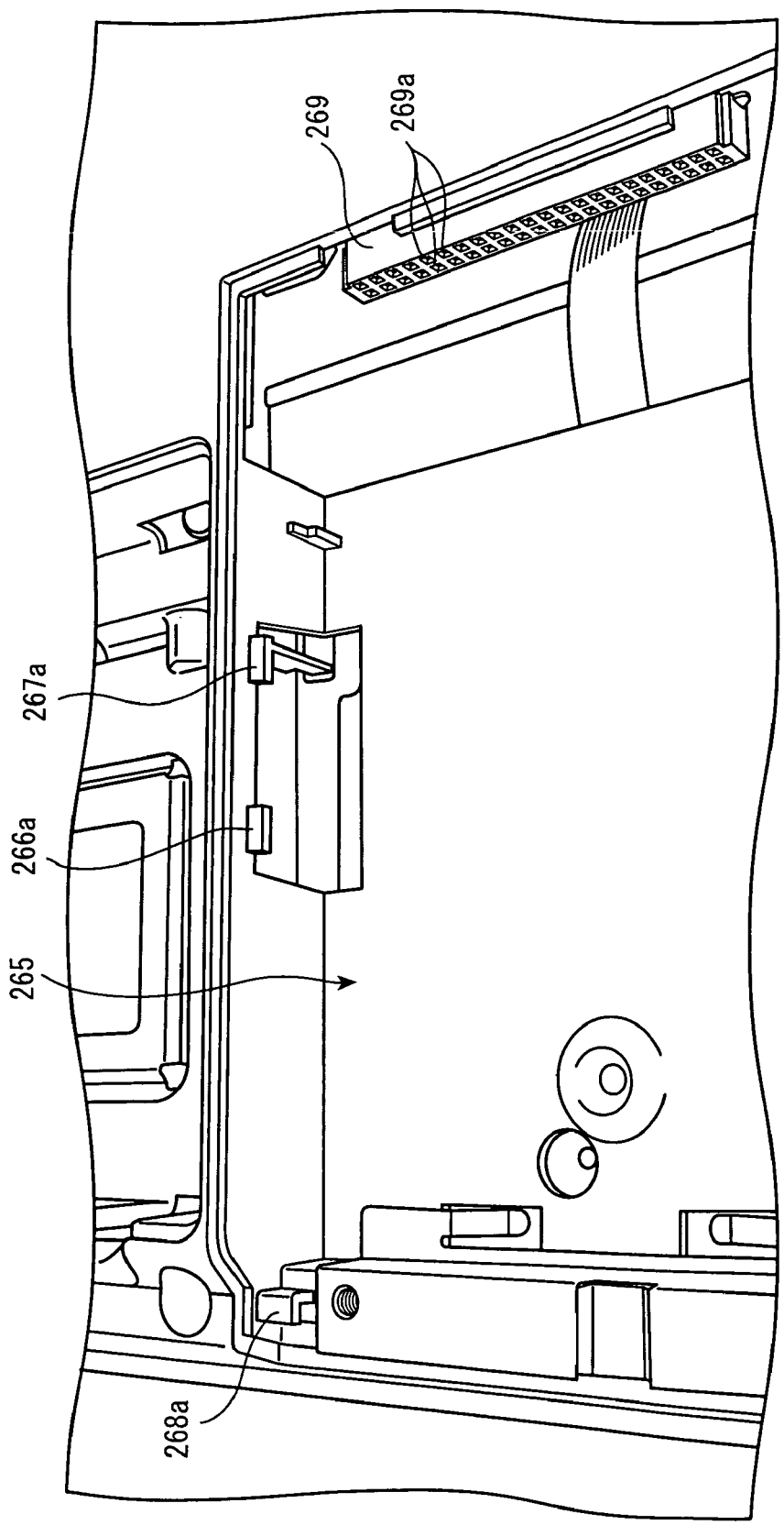
FIG. 27 is a perspective view of one side of the opening in which the hard disc drive unit is housed.

FIG. 27 is a perspective view of one side of the opening 265 in which the hard disc drive unit 270 is housed.

As shown in FIG. 27, the side of the opening 265 is configured such that the metal frame 272 (see FIG. 22) goes under the projection 266a disposed at the side of the opening 265 when the hard disc drive 270 is housed in the opening 265. The same holds true for the projection 266b at the other side of the opening 265.

Figure 28:
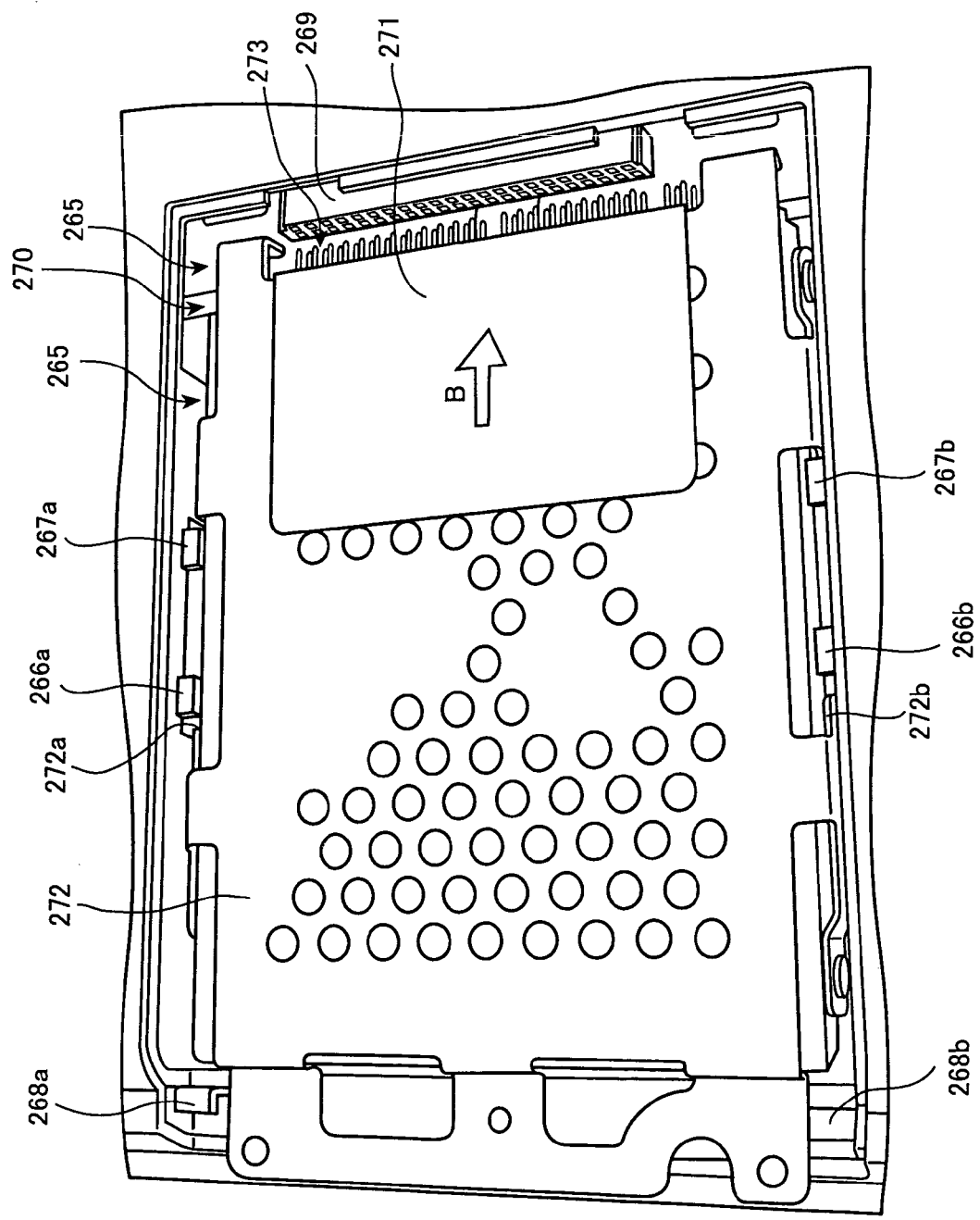
FIG. 28 show the state in which the hard disc drive is about to be housed by being placed in the correct position in the opening of the hard disc drive unit.
Figure 29:
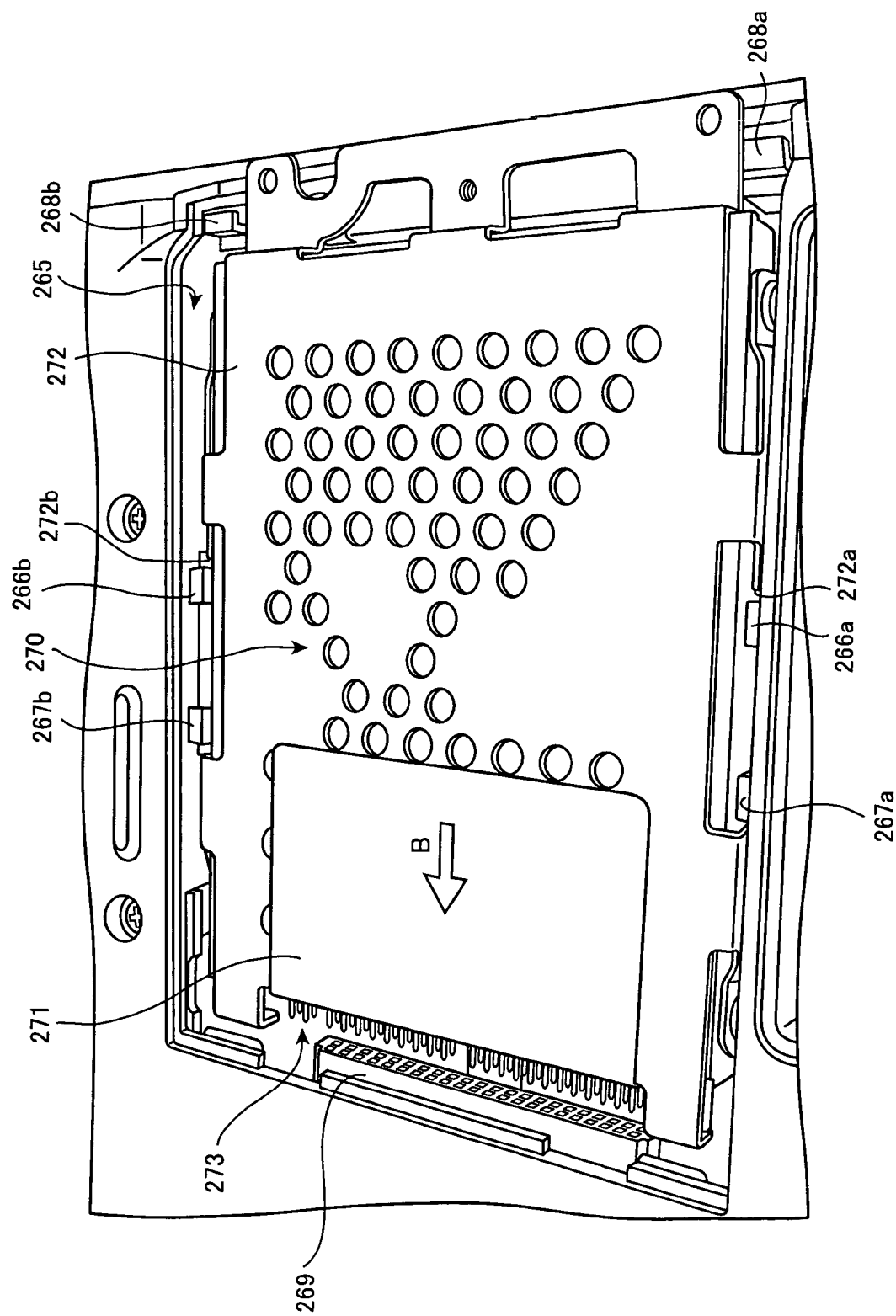
FIG. 29 also show the state in which the hard disc drive is about to be housed by being placed in the correct position in the opening of the hard disc drive unit.

FIGS. 28 and 29 show the state in which the hard disc drive 270 is about to be housed in the correct position in the opening 265.

The hard disc drive unit 270 is placed in the position indicated in FIGS. 28 and 29, and pressed in the direction indicated by the arrow B, thereby making the unit side connector 273 to be engaged with the apparatus side connector 269. As the hard disc drive unit 270 is placed in the correct position, the interfering sections 272a, 272b of the metal frame 272 of the hard disc drive unit 270 do not interfere with the projections 266a and 266b provided in the opening 265, so that the hard disc drive unit 270 goes under the 266a and 266b.

Figure 30:
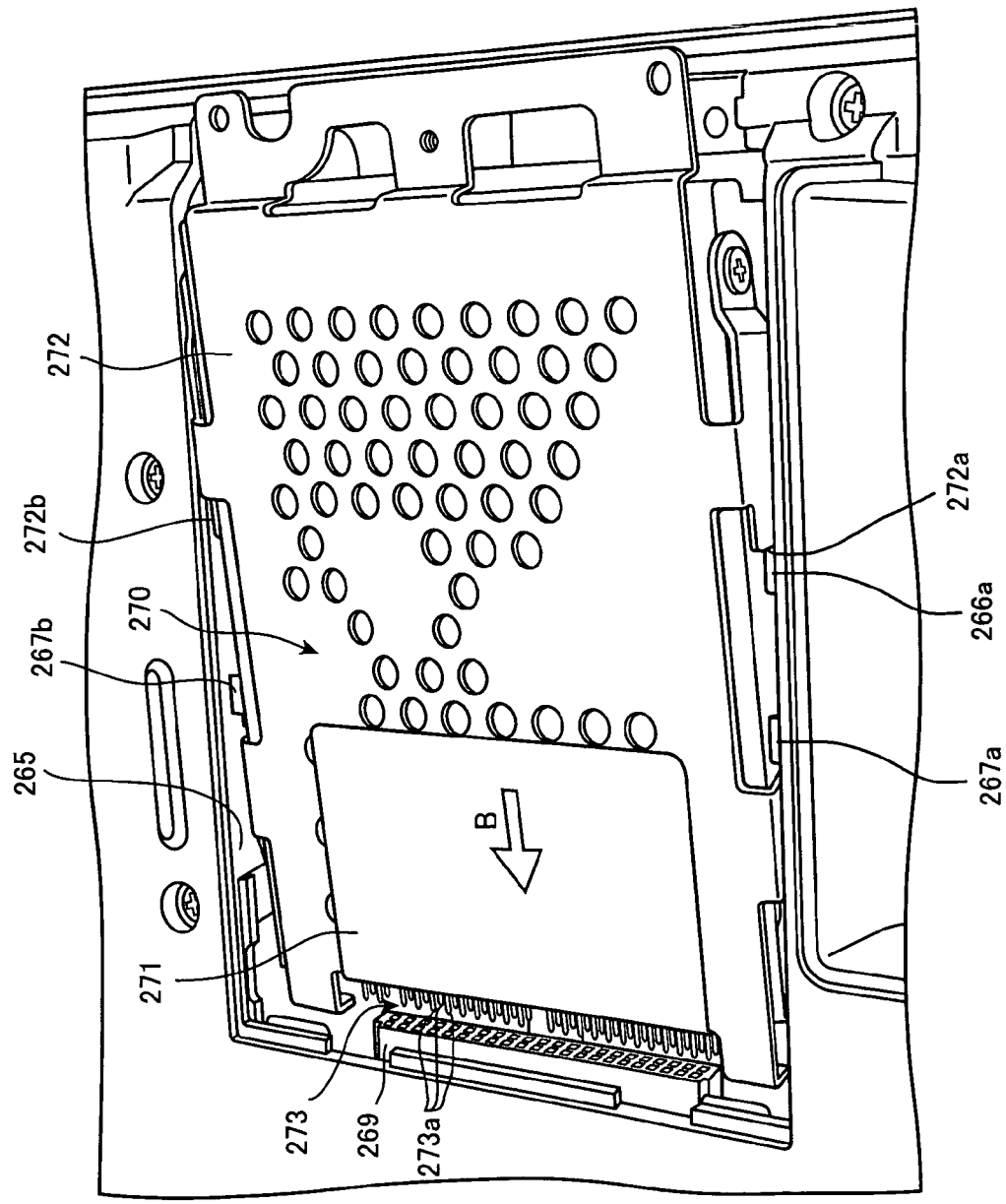
FIG. 30 shows the state in which the hard disc drive unit with its back obliquely lifted is placed in the opening.

FIG. 30 shows the state in which the hard disc drive unit 270 with its back obliquely lifted is placed in the opening 265.

If the hard disc drive unit 270 is pushed in the direction indicated by the arrow B while keeping the posture shown in FIG. 30, the interfering section 272a, 272b interfere with the projections 266a, 266b, resulting in failure of engagement between the unit side connector 273 and the apparatus side connector 269. Thus, it is possible to prevent failures such as bent-back of the connection pins 273a due to forced engagement.

FIG. 30 shows the case in which the back of the hard disc drive unit 270 is obliquely lifted. However, the same holds true for the case in which the whole of the hard disc drive unit 270 is lifted from the opening 265 in a horizontal posture. Further, there may be a case in which the connection pins 273a aligned in the lower row of the unit side connector 273 are inserted in the insertion holes 269a aligned in the upper row of the apparatus side connector 269. In such a case, however, the interfering section 272a, 272b are to be positioned over the projections 266a, 266b, and thus the hard disc drive unit 270 cannot be housed in the opening 265 nor the cover member 261 (see FIG. 19) for closing the opening 265 can be attached. Accordingly, it is easy to grasp that the hard disc drive unit 270 is not properly housed in the opening 265, making it possible to prevent such a wrong engagement. Additionally, there may be a case that the hard disc drive unit 270 is lifted so obliquely that the interfering section 272a, 272b can go over the projections 266a, 266b, and the connection pins 273a aligned in the lower row of the unit side connector 273 can be forcibly inserted in the insertion holes 269a aligned in the upper row of the apparatus side connector 269. In such a case, however, the interfering section 272a, 272b are to be positioned over the projections 266a, 266b, and thus the hard disc drive unit 270 cannot be housed in the opening 265 nor the cover member 261 (see FIG. 19) for closing the opening 265 can be attached. Accordingly, it is easy to grasp that the hard disc drive unit 270 is not properly housed in the opening 265.

When the hard disc drive unit 270 is housed in the opening 265 in the correct position, the interfering section 272a, 272b are positioned under the projections 266a, 266b. Accordingly, when the hard disc drive unit 270 is removed from the opening 265, it is not possible to lift the back of the hard disc drive unit 270 before releasing the engagement between the connectors 269 and 273. Thus, it is possible to secure that the unit side connector 273 is properly pulled from the apparatus side connector 269.

Figure 31:
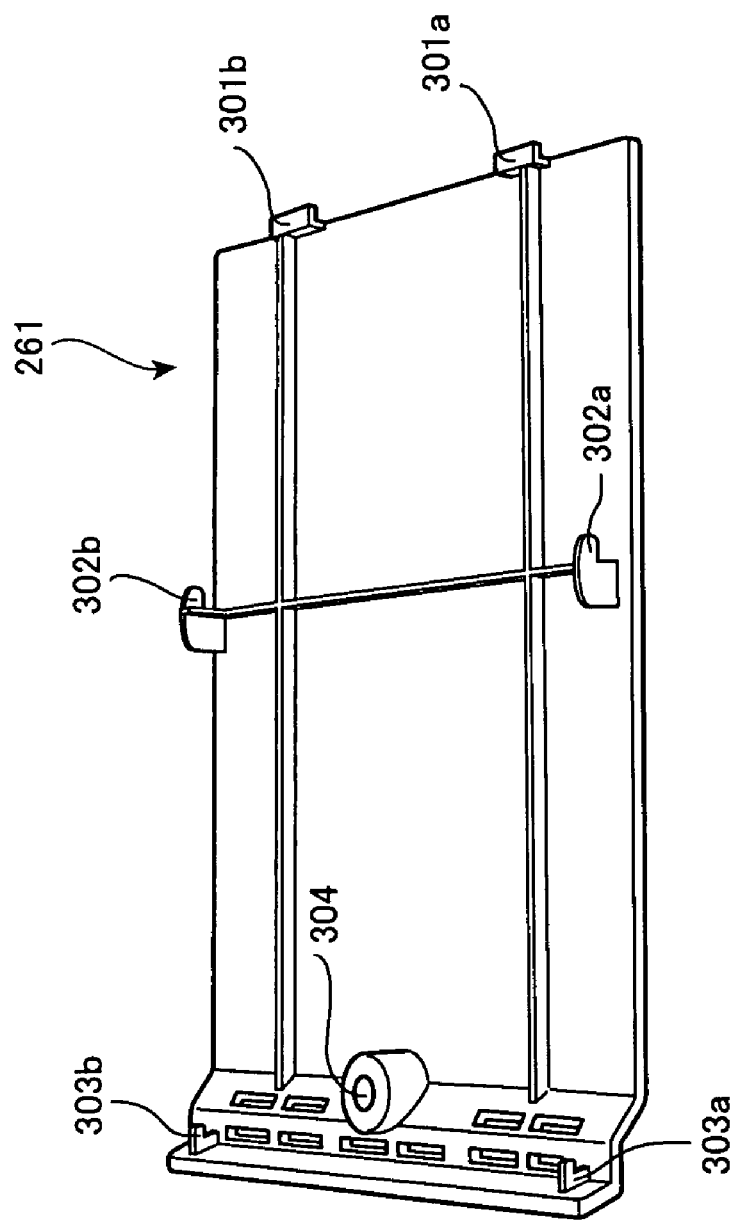
FIG. 31 shows a back face of the cover member for closing the opening in which the hard disc drive unit is housed.

FIG. 31 shows a back face of the cover member 261 for closing the opening 265 in which the hard disc drive unit 270 is housed.

On the back face of the cover member 261, disposed are two projections 301a, 301b projecting toward the depth of the opening 265 (see FIG. 21), two projecting claws 302a and 302b engaging the two projections 267a and 267b that are disposed at both sides of the opening 265 and projecting inside thereof, and two engaging claws 303a, 303b engaging the two projections 268a, 268b that project from the back end of the opening 265. Additionally, the cover member 261 has a hole 304 formed at the back side thereof. The cover member 261 closes the opening 265, as shown in FIG. 19, by engaging the two projections 301a, 301b, the projecting claws 302a, 302b, and the engaging claws 303a, 303b of the cover member 261 with the corresponding parts of the opening 265 and by screwing in the hole 304.

(Structure of PC Card Slot)

Figure 32:
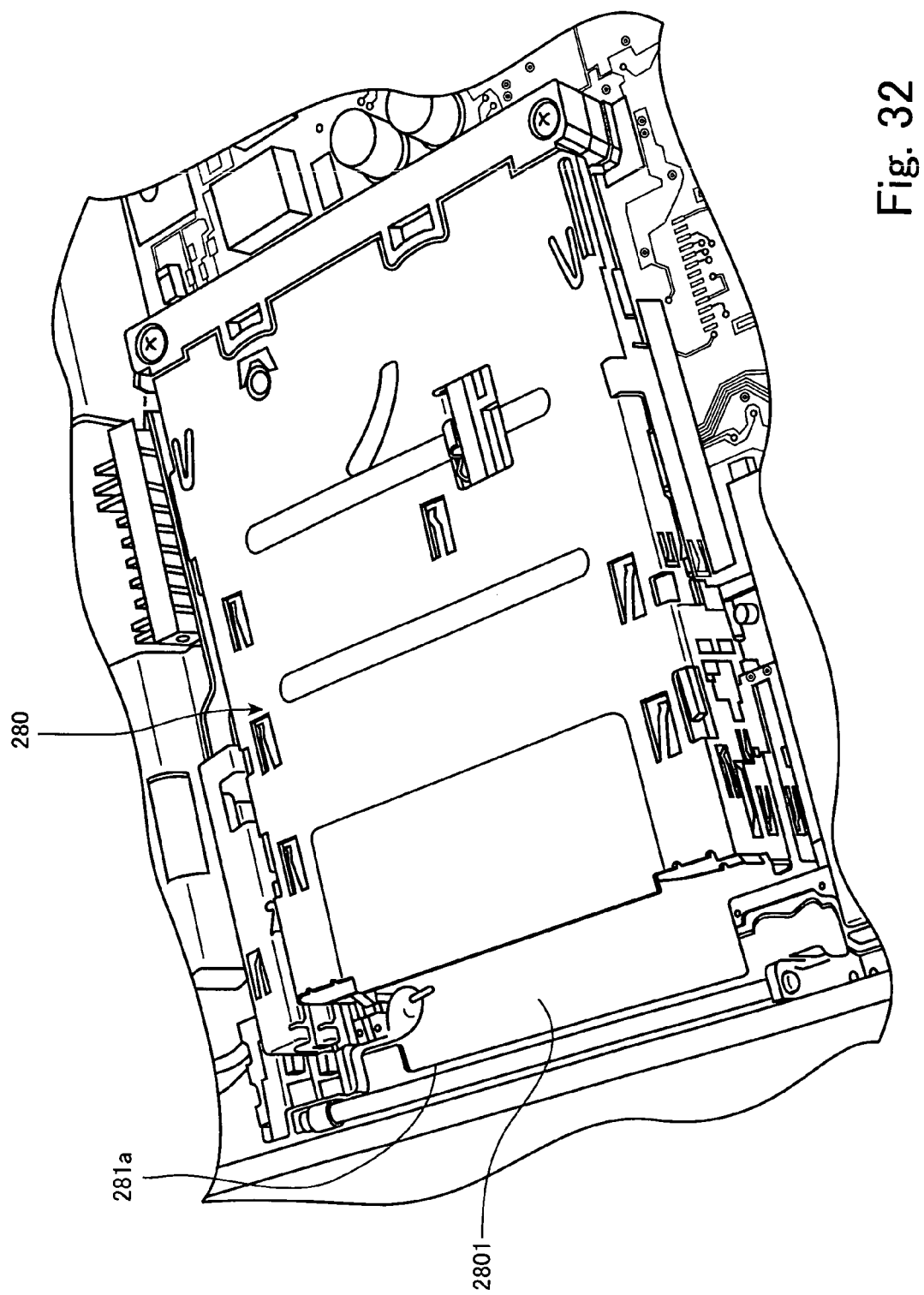
FIG. 32 is a perspective view of the PC card slot 280.
Figure 33:
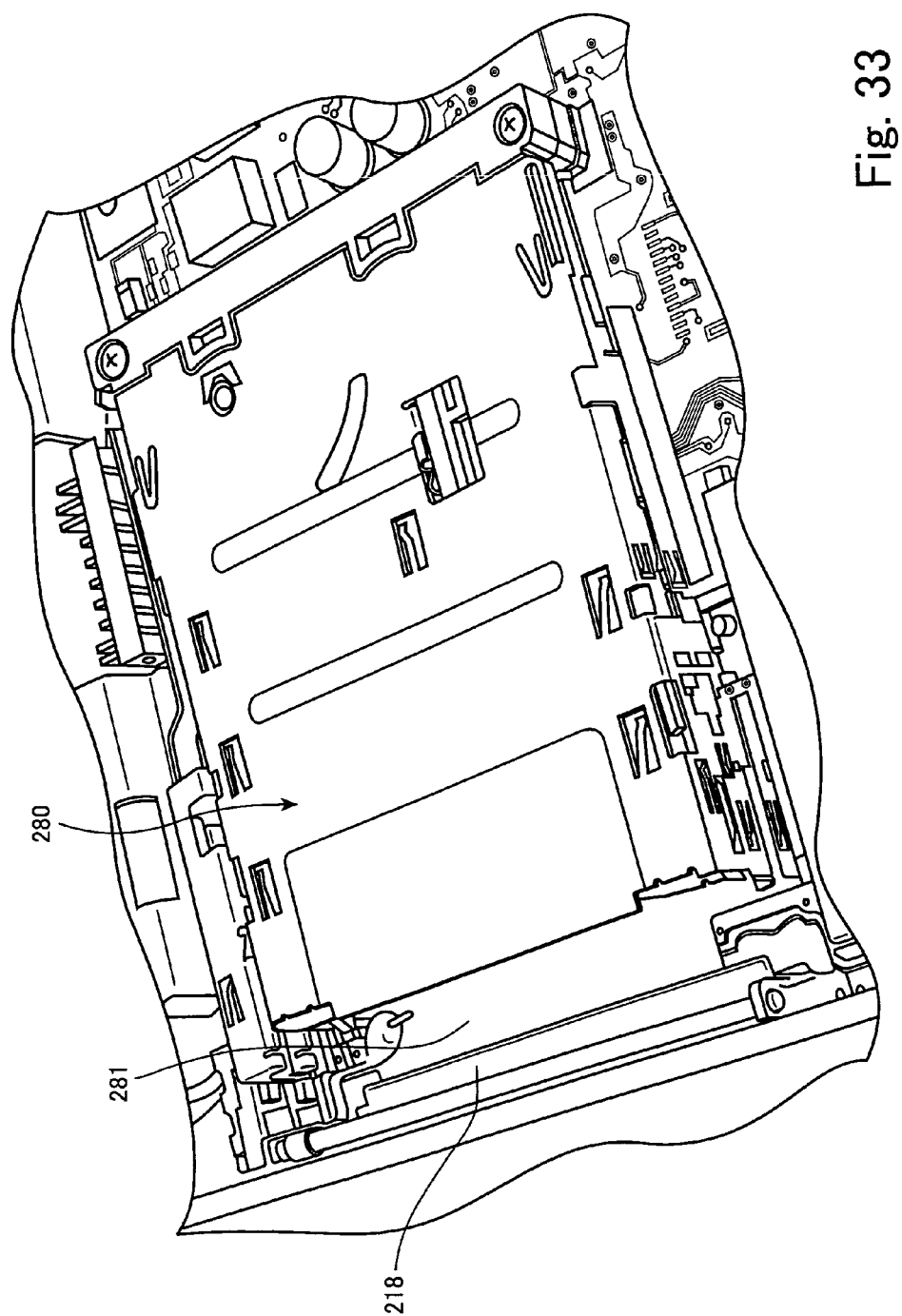
FIG. 33 is a perspective view of the PC card slot shown in FIG. 32, with the lower cover member shown in FIG. 6 opened.

FIG. 32 is a perspective view of the PC card slot 280, FIG. 33 is a perspective view of the PC card slot 280 shown in FIG. 32, with the lower cover member shown in FIG. 6 opened.

The PC card slot 280 is disposed in the housing of the notebook PC 10 inside the PC card loading opening 216 (see FIG. 6) formed in the flank of the right side of the notebook PC 10, such that it faces the PC card loading opening 216. The PC card slot 280 is consisted of a metal frame and configured to accommodate two PC cards vertically which are inserted in the PC card loading opening 216. A circuit board mounted with circuits for accessing a PC card inserted in the PC card slot 280 is provided under the PC card slot 280. An insulation sheet 2801, whose front end 2801a extends close to the PC card loading opening 216 (see FIG. 6), is spread between the circuit board and the PC card slot 280 of metal frame for securing electrical insulation therebetween.

As described in FIG. 6, the PC card loading opening 216 is configured such that the upper and lower cover members 217 and 218 are openably closed. A PC card is received by the PC card loading opening 216 as follows: when a PC card is inserted into the PC card loading opening 216, the upper cover member 217 is pressed by the front end of the PC card and rotated such that the upper cover member 217 is lifted up around the top edge 217a thereof; when the lower cover member 218 is pressed by the front end of the PC card, the lower cover member 218 is rotated such that the lower cover member 218 goes down around the bottom edge 218a thereof.

FIG. 33 shows the state that the lower cover member 218 of the two cover members for closing the PC card loading opening 216 is opened. The opened cover member 218 covers the front end 2801a of the insulation sheet 2801, which prevents the PC card inserted in the PC card loading opening 216 from abutting the front end 2801a of the insulation sheet 2801 and thus the insulation sheet 2801 from being turned up.

Figure 34:
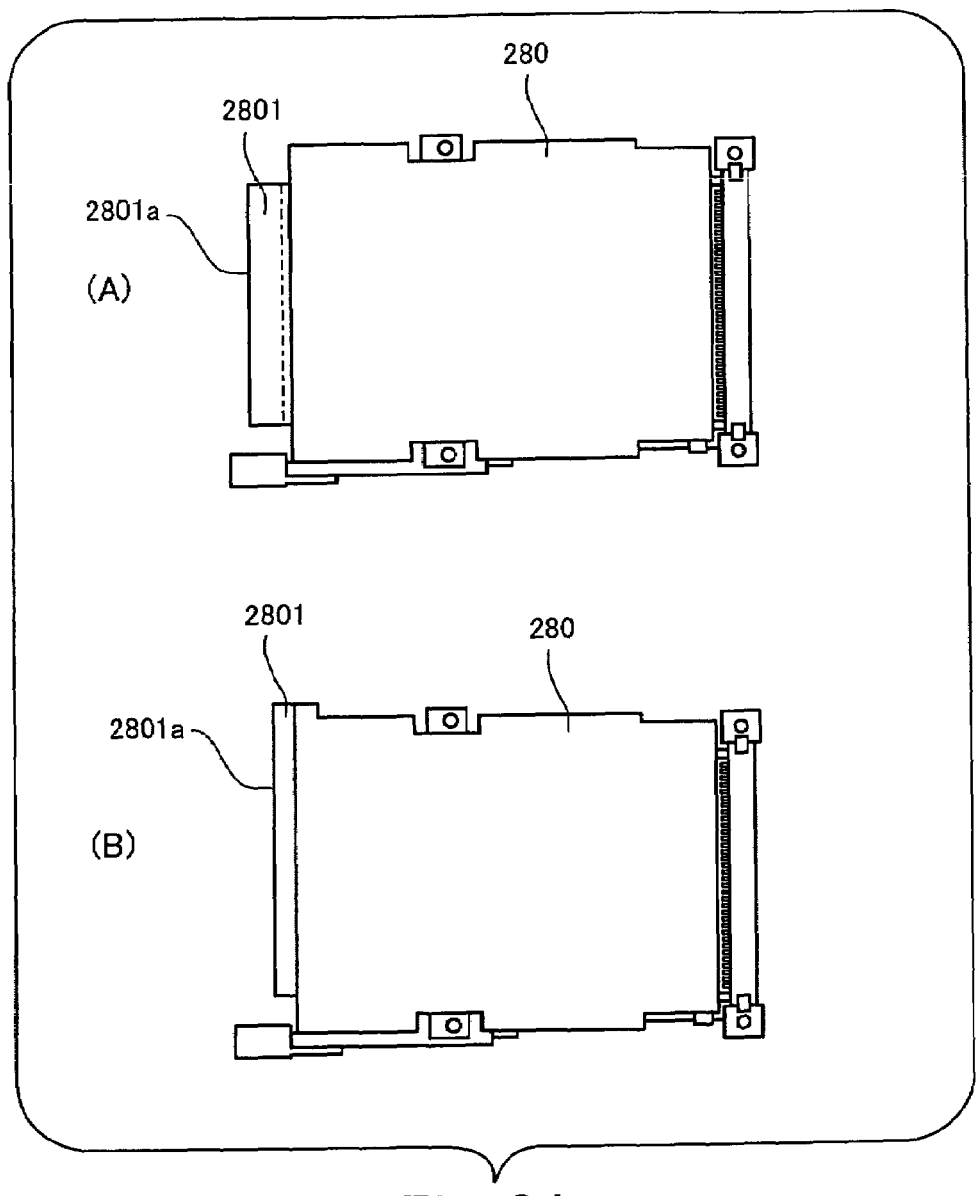
FIG. 34 compares the PC card slot (A) according to the embodiment of the notebook PC of the invention with a typical example of the conventional PC card slot (B)

FIG. 34 compares the PC card slot (A) according to the embodiment of the notebook PC of the invention with a typical example of the conventional PC card slot (B).

In the case of the typical conventional PC card slot (B), the front end of the insulation sheet 2801 is adhered onto a circuit board thereunder by using a double side tape. The front end of the circuit board is flush with the front end 2801a of the insulation sheet 2801. Thus, if a PC card is inserted downward and obliquely, the front end of the PC card abuts the front end 2801a of the insulation sheet 2801. Frequent occurrence of such abutting causes the front end 2801a of the insulation sheet 2801 to be turned up and thereby damaging the circuit board by the front end of the PC card, leading to malfunction of the apparatus.

On the other hand, in the notebook PC of the embodiment, the circuit board is shorter relative to the typical conventional PC card slot (B), as indicated by dotted lines in FIG. 34 (A), and the insulation sheet 2801 is extended closer to the PC card loading opening 216 (see FIG. 6). Accordingly, as shown in FIG. 32, the front end 2801a of the insulation sheet 2801 is covered by the downwardly opened cover member 218, which prevents the insulation sheet 2801 from being turned up and thereby prevents damage of the circuit board. Additionally, the need to adhere the insulation sheet 2801 onto the circuit board is eliminated, resulting in decrease in the number of assembly works.

(Structure of Disc Drive Unit)

Figure 35:
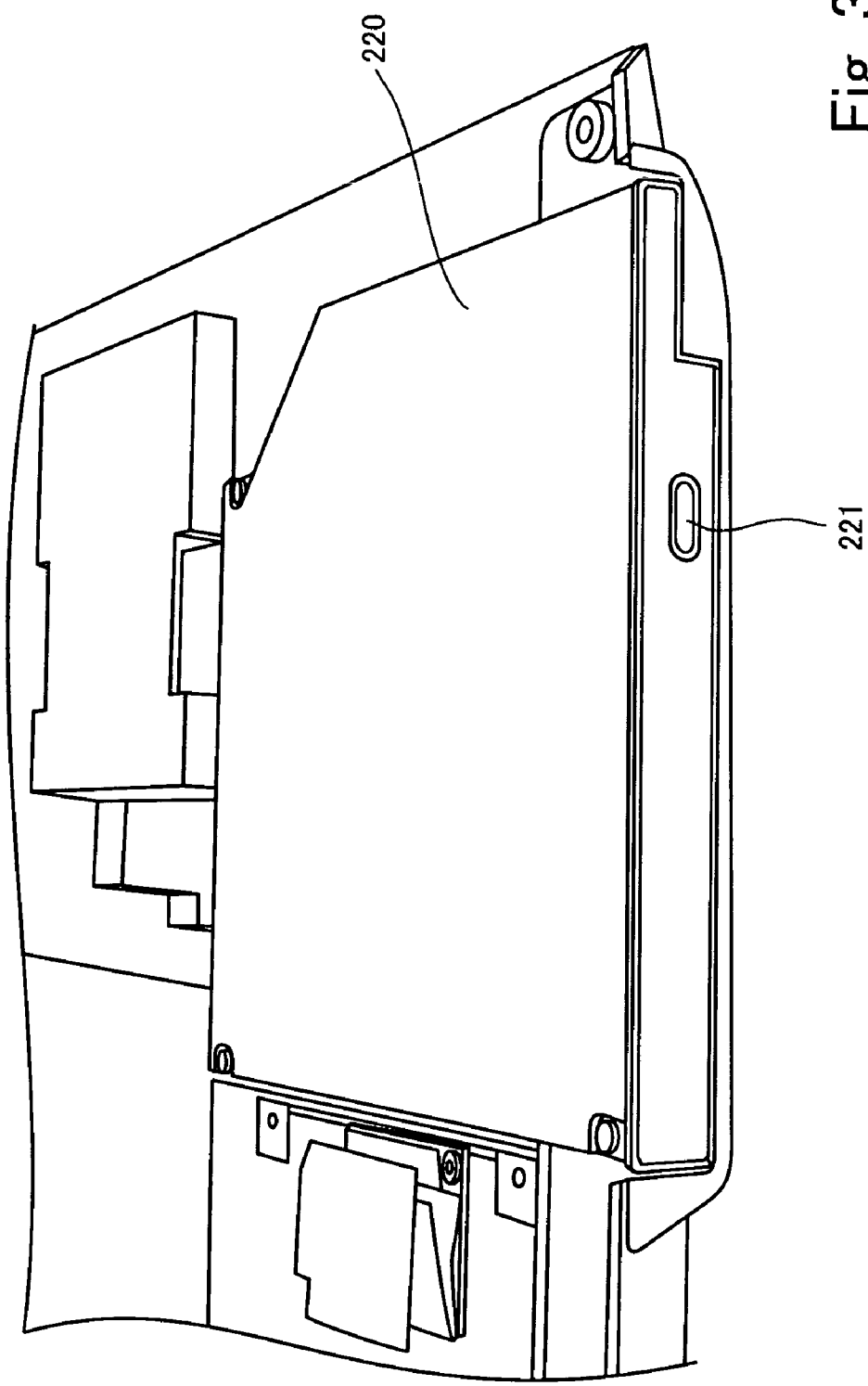
FIG. 35 is a perspective view of the disc drive unit with the top cover of the housing of the main unit of the notebook PC removed therefrom.

FIG. 35 is a perspective view of the disc drive unit 220 with the top cover of the housing of the main unit 20 of the notebook PC 10 removed therefrom.

The disc drive unit 220, as shown in FIG. 7, is inserted from the opening formed in the left-side flank of the housing of the main unit 20 to be housed therein.

Figure 36:
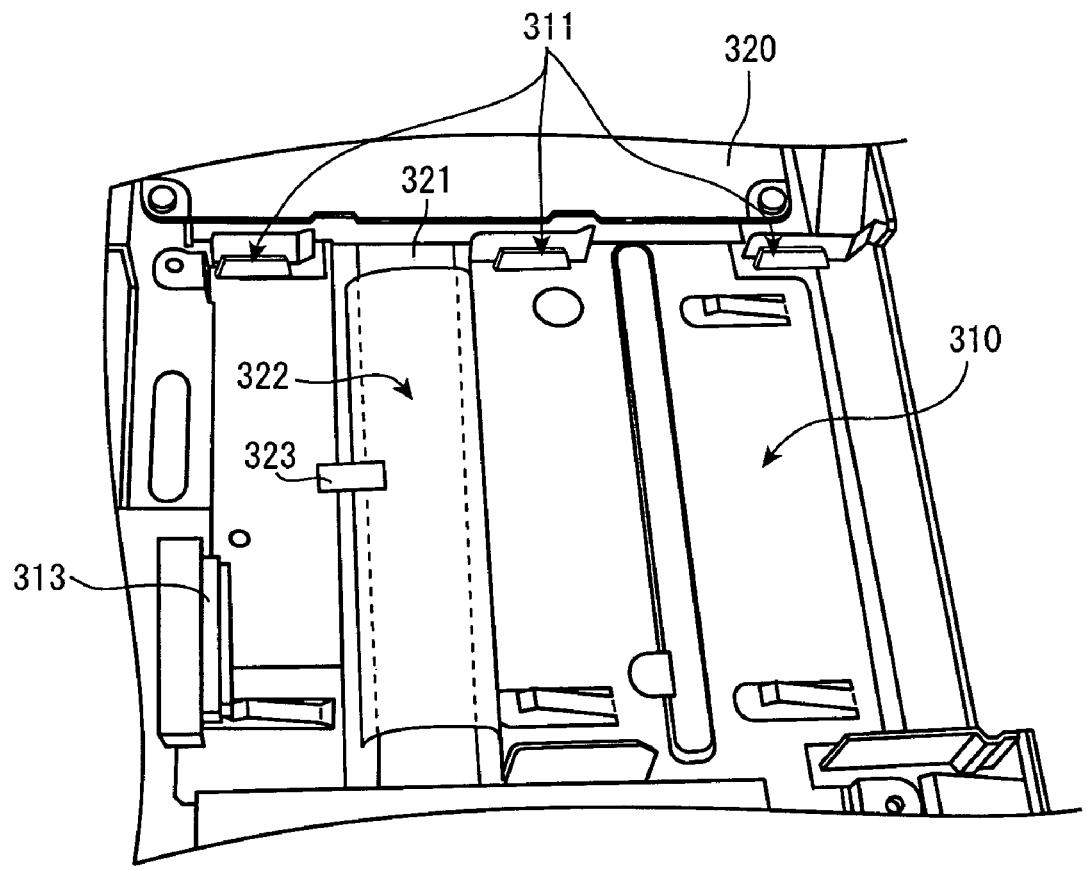
FIG. 36 shows a disc drive unit accommodating section to accommodate the disc drive unit.
Figure 37:
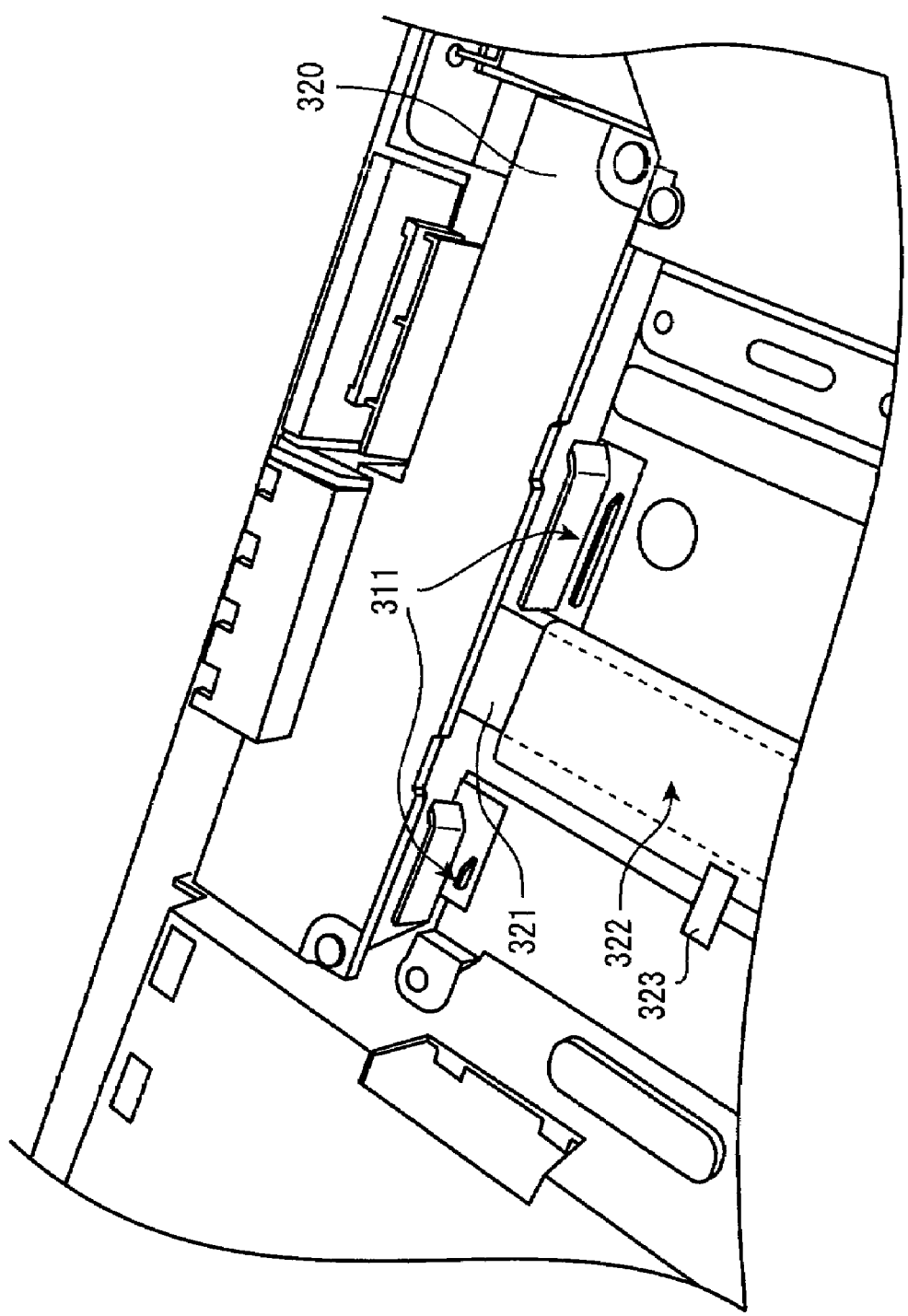
FIG. 37 shows one side-end of the disc drive unit accommodating section.
Figure 38:
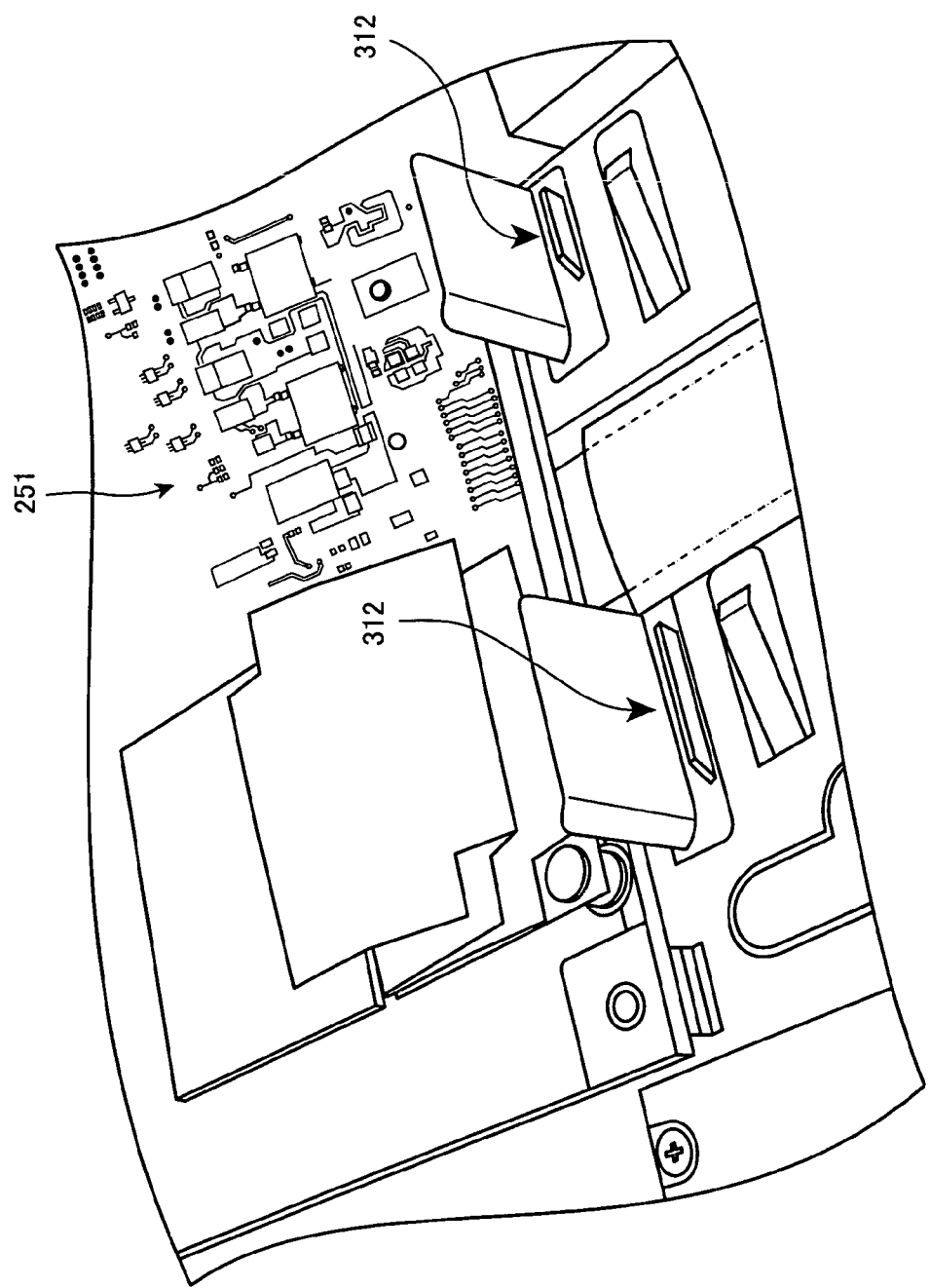
FIG. 38 shows the other side-end of the disc drive unit accommodating section.

FIG. 36 shows a disc drive unit accommodating section to accommodate the disc drive unit 220, FIG. 37 shows one side-end of the disc drive unit accommodating section 310, and FIG. 38 shows the other side-end thereof.

When the disc drive unit 220 is accommodated in the disc drive unit accommodating section 310 while guided by rails 311, 312 in the both sides thereof and inserted into the position where a connector (not shown) of the disc drive unit 220 is engaged with an apparatus side connector 313. The face of the inserted disc drive unit 220 becomes flush with that of the housing of the main unit 20 of the notebook PC 10 as shown in FIG. 7.

The main circuit board 251 (see FIG. 38) and a sub circuit board 320 (see FIG. 36) are disposed at the both sides of the disc drive unit accommodating section 310. Thus, a flat cable 321 for electrically connecting the main circuit board 251 and the sub circuit board 320 is laid across the disc drive unit accommodating section 310. The flat cable 321 may be a flexible wiring board. The flat cable 321 is arranged under the disc drive unit 220 after the disc drive unit 220 is accommodated in the disc drive unit accommodating section 310. Thus, without taking any precaution, the disc drive unit 220 inserted into the disc drive unit accommodating section 310 may be caught on the flat cable 321, leading to failures such as disconnection. Therefore, a sheet 322 is provided such that the flat cable 321 is wrapped by the sheet 322 folded back at a position close to the opening for the disc drive unit 220. The sheet 322 is adhered to a face of the disc drive unit accommodating section 310 at a position away from the opening for the disc drive unit 220 by using an adhesive tape 323.

As the flat cable 321 is wrapped by the sheet 322, it is possible to prevent the disc drive unit 220 inserted into the disc drive unit accommodating section 310 from being caught on the flat cable 321 and thus occurrence of failures such as disconnection can be prevented.

Figure 39:
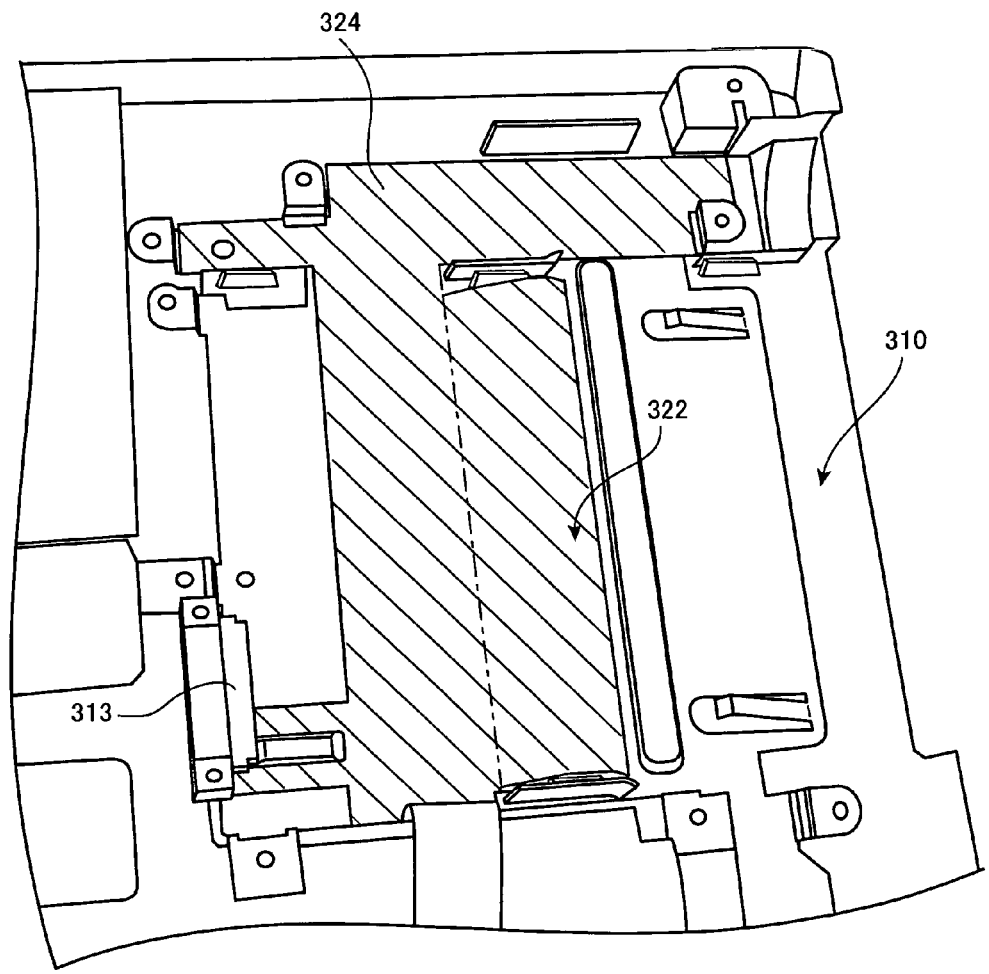
FIG. 39 shows a sheet to be spread under a sub circuit board, with the sub circuit board and a flat cable removed therefrom.

FIG. 39 shows a sheet to be spread under the sub circuit board 320, with the sub circuit board 320 and the flat cable 321 removed therefrom.

An insulation sheet 324 is spread under the sub circuit board 320 for insulating electrical connection between the sub circuit board 320 and the housing of the main unit 20. It should be noted that the sheet 322, which wraps the flat cable 321 as shown in FIGS. 36 and 37, is formed by extending the insulation sheet 324. This suppresses increase in the number of the components.

Figure 40:
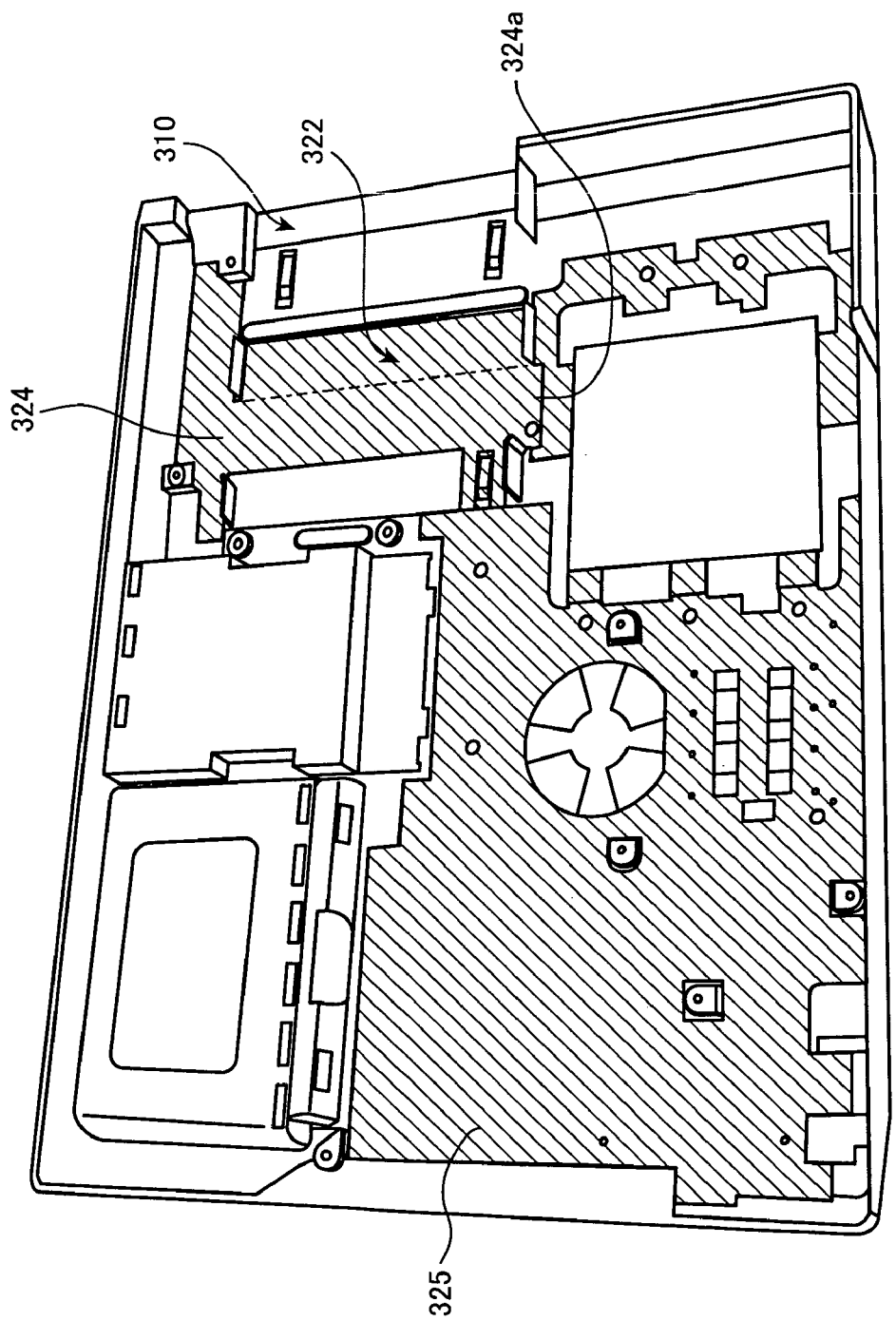
FIG. 40 shows an insulation sheet that is spread under the main and sub circuit boards with the circuit boards removed therefrom.

FIG. 40 shows an insulation sheet that is spread under the main and sub circuit boards 251, 320, with the circuit boards 251, 320 removed therefrom.

An insulation sheet 325 is laid under the main circuit board 251. The insulation sheet 324 laid under the sub circuit board 320 and the insulation sheet 325 laid under the main circuit board 251 overlap at least at the front end 324a of the insulation sheet 324 that extends across the disc drive unit accommodating section 310 to the side of the main circuit board 251. According to the embodiment, it is intended to prevent the disc drive unit 220 inserted into the disc drive unit accommodating section 310 from being caught on the flat cable 321, by using the insulation sheet 324 for the sub circuit board 320 to wrap the flat cable 321 running across the disc drive unit accommodating section 310.

What is claimed is:

1. An apparatus comprising:
  a first heat generating component;
  a second heat generating component arranged close to a side of the first heat generating component;
  a heat radiating member that absorbs heat from both the first heat generating component and the second heat generating component and radiates heat;
  wherein the heat radiating member comprises:
  a base section that extends horizontally and contacts the first heat generating component on the bottom surface of the base section;
  a pair of arms that extend horizontally at both ends of the base section from the base section indecomposably, have a fastener for fastening the heat radiating member, and contact the second heat generating component under one of the pair of arms;
  a plurality of heat radiating fins that stand on the base section; and a fixed section that extends from both ends of the heat radiating fins and over a top surface of the heat radiating fins,
wherein the pair of arms are formed by extending the fixed section.

2. The apparatus according to claim 1, wherein the apparatus is a first type of apparatus or a second type of apparatus, the first type of apparatus having a structure that the second heat generating component is arranged close to one of sides of the first heat generating component, the second type of apparatus having a structure that the second heat generating component is arranged close to the other of the sides of the first heat generating component,
wherein the heat radiating member is compatible with the first and the second types of apparatuses, and
wherein, in the first type of apparatus, one of the arms of the heat radiating member is made to contact the second heat generating component thereunder, and in the second type of apparatus, the other of the arms is made to contact the second heat generating component thereunder.

3. The apparatus according to claim 2, wherein height of a top surface of the second heat generating component with reference to a top surface of the first heat generating component differs between the first apparatus and the second apparatus,
wherein at least one of the arms has a projection partially formed therein that absorbs difference in height of the second heat generating component between the first apparatus and the second apparatus.

4. The apparatus according to claim 1, wherein the first heat generating component is a CPU performing data processing.

5. A data processing apparatus that performs data processing comprising:
a first heat generating component;
a second heat generating component arranged close to a side of the first heat generating component;
a heat radiating member that has heat radiating fins for air cooling, absorbs heat from both the first heat generating component and the second heat generating component and radiates heat, the heat radiating member including:
a base section that extends horizontally and contacts the first heat generating component on the bottom surface of the base section;
a pair of arms that extend horizontally at both ends of the base section from the base section indecomposably, have a fastener for fastening the heat radiating member, and contact the second heat generating component under one of the pair of arms;
a plurality of heat radiating fins that stand on the base section; and
a fixed section that extends from both ends of the heat radiating fins and over a top surface of the heat radiating fins, wherein the pair of arms are formed by extending the fixed section;
a fan that sends air toward the heat radiating member; and
a housing incorporating the first and the second heat generating components, the heat radiating member and the fan, the housing including:
a keyboard for input operation arranged on a top surface thereof; and
an opening that discharges air warmed up by the heat radiating member to outside, the opening formed in one side of the apparatus.

6. The data processing apparatus according to claim 5, wherein the opening is formed in a back face of the housing and the fan is arranged at least partially under the keyboard and the heat radiating member is arranged at a position behind the keyboard.

7. The data processing apparatus according to claim 5, further comprising a second housing in addition to the housing as a first housing, the second housing being connected through a hinge to the first housing at the back of the first housing such that the second housing is openable and closable relative to the first housing, and has a display screen that displays an image.

8. The data processing apparatus according to claim 5, wherein the data processing apparatus is a first type of data processing apparatus or a second type of data processing apparatus, the first type of data processing apparatus having a structure that the second heat generating component is arranged close to one of sides of the first heat generating component, the second type of data processing apparatus having a structure that the second heat generating component is arranged close to the other of the sides of the first heat generating component,
wherein the heat radiating member is compatible with the first and the second types of data processing apparatuses, and
wherein, in the first type of data processing apparatus, one of the arms is made to contact the second heat generating component thereunder, and in the second type of data processing apparatus, the other of the arms is made to contact the second heat generating component thereunder.

9. The data processing apparatus according to claim 8, wherein height of a top surface of the second heat generating component with reference to a top surface of the first heat generating component differs between the first apparatus and the second apparatus,
wherein at least one of the arms has a projection partially formed therein that absorbs difference in height of the second heat generating component between the first and the second type of apparatuses.

10. A heat radiating member which is provided in an apparatus having a first heat generating component and a second heat generating component, and which absorbs heat from both the first heat generating component and the second heat generating component and radiates heat, the heat radiating member comprising:
a base section that extends horizontally and contacts the first heat generating component on the bottom surface of the base section;
a pair of arms that extend horizontally at both ends of the base section from the base section indecomposably, have a fastener for fastening the heat radiating member, and contact the second heat generating component under one of the pair of arms;
a plurality of heat radiating fins that stand on the base section; and
a fixed section that extends from both ends of the heat radiating fins and over a top surface of the heat radiating fins,
wherein the pair of arms is formed by extending the fixed section.

11. The heat radiating member according to claim 10,
wherein the apparatus is a first type of apparatus or a second type of apparatus, the first apparatus having a structure that the second heat generating component is arranged close to one of sides of the first heat generating component, the second type of apparatus having a structure that the second heat generating component is arranged close to the other of the sides of the first heat generating component, wherein the heat radiating member is compatible with the first and the second types of apparatus, and wherein, in the first type of apparatus, one of the arms is made to contact the second heat generating component thereunder, and in the second type of apparatus, other of the arms is made to contact the second heat generating component thereunder.

12. The heat radiating member according to claim 11, wherein height of a top surface of the second heat generating component with reference to a top surface of the first heat generating component differs between the first apparatus and the second apparatus, wherein at least one of the arms has a projection partially formed therein that absorbs difference in height of the second heat generating component between the first apparatus and the second apparatus.

* * * * *